United States Patent
Moriat

(10) Patent No.: US 7,565,280 B2
(45) Date of Patent: Jul. 21, 2009

(54) SOLVER FOR SIMULATING A SYSTEM IN REAL TIME ON A PROGRAMMABLE HARDWARE ELEMENT

(75) Inventor: Alain Moriat, Copenhagen (DK)

(73) Assignee: National Instruments Corporation, Austin, TX (US)

( * ) Notice: Subject to any disclaimer, the term of this patent is extended or adjusted under 35 U.S.C. 154(b) by 560 days.

(21) Appl. No.: 11/356,711

(22) Filed: Feb. 17, 2006

(65) Prior Publication Data
US 2007/0198240 A1 Aug. 23, 2007

(51) Int. Cl.
G06F 9/45 (2006.01)
H03K 17/693 (2006.01)
(52) U.S. Cl. .......................... 703/22; 716/16
(58) Field of Classification Search ............... 703/7; 716/16; 702/189
See application file for complete search history.

(56) References Cited

U.S. PATENT DOCUMENTS

| | | | |
|---|---|---|---|
| 6,247,164 B1 | 6/2001 | Ashar et al. | |
| 6,577,925 B1 | 6/2003 | Fromherz | |
| 6,584,601 B1 | 6/2003 | Kodosky et al. | |
| 6,678,877 B1* | 1/2004 | Perry et al. | 716/15 |
| 6,823,283 B2 | 11/2004 | Steger et al. | |
| 7,167,817 B2 | 1/2007 | Mosterman et al. | |
| 2002/0186245 A1* | 12/2002 | Chandhoke et al. | 345/764 |
| 2003/0149962 A1 | 8/2003 | Willis et al. | |
| 2003/0163298 A1 | 8/2003 | Odom et al. | |
| 2005/0198472 A1* | 9/2005 | Sih et al. | 712/218 |
| 2005/0257195 A1 | 11/2005 | Morrow et al. | |
| 2006/0109891 A1 | 5/2006 | Guo et al. | |

FOREIGN PATENT DOCUMENTS

WO  03046775 A1  6/2003

OTHER PUBLICATIONS

Sen M. Kuo, Woon S. Gan, "Digital Signal Processor Architectures and Programming" IEEE 0-7803-8660, 2004. pp. 365-368.*
International Search Report and Written Opinion for International application No. PCT/US2007/062135 mailed Jun. 15, 2007.

* cited by examiner

Primary Examiner—Paul L Rodriguez
Assistant Examiner—Dwin M Craig
(74) Attorney, Agent, or Firm—Meyertons Hood Kivlin Kowert & Goetzel, P.C.; Jeffrey C. Hood; Jason L. Burgess

(57) ABSTRACT

A method for performing a simulation of a system. The system includes an FPGA that is configured to implement simulation logic, such as a generic solver. For example, the FPGA device may implement a generic time domain solver or a generic frequency domain solver. The FPGA device is also configured with information representing a system model of the system under simulation. The system also includes input hardware for providing input signals for the simulation to the FPGA device and output hardware for receiving output signals computed by the simulation from the FPGA device. The system may be reconfigured to simulate different systems by changing the system model, without requiring the simulation logic (e.g., the generic solver) to be changed.

23 Claims, 28 Drawing Sheets

SOLVER FOR SIMULATING A SYSTEM IN REAL TIME ON A PROGRAMMABLE HARDWARE ELEMENT

FIELD OF THE INVENTION

The present invention relates to the field of real-time simulation. More particularly, the invention relates to a solver implemented in hardware, where the solver is operable to perform real time simulations for different systems without requiring changes to the solver itself.

DESCRIPTION OF THE RELATED ART

System Simulation

Simulation of a system may be implemented using software, hardware, or a combination of both. Creating a system simulation typically involves creating a model of the system, where the model represents the system or represents certain aspects of the system. For a given system, the system may be modeled in any number of different ways. Thus, the type of model that is created may depend on the particular aspects of the system that the modeler is interested in or the particular purpose of performing the simulation. For example, depending on the particular system and the particular problem to be solved, modeling the system may involve creating a set of mathematical equations representing the system, creating representations of various structural elements of the system and relationships between the elements, creating representations of random factors that may affect the system, etc. Creating a model of a system generally involves simplifying or approximating certain aspects of the system. However, for some systems or problems, a simple, abstracted model may serve to solve the problem at hand quite well, whereas for other systems or problems, a more complex model representing many details of the actual system may be desirable.

There are many reasons why it may be necessary or desirable to simulate a system. One common situation where simulation is useful is when the real system has not yet been created. In this instance, existing measurement/control logic may be coupled with a system simulation in the measurement/control loop, in order to test design variations and predict whether the planned system will operate as desired.

As another example, in many situations, it may be necessary to test the measurement/control logic that will be used in an actual measurement/control loop, but it may be infeasible, impractical, or impossible to do so with the real system. For example, it may be necessary to test whether the measurement/control logic will work properly under extreme or emergency situations in which it would be dangerous or economically infeasible to perform the test with a real system, e.g., due to the possibility of harm to the system or the environment of the system. Also, the real system may operate under conditions that make it impossible to perform or monitor a test, as in a space flight or deep-sea dive.

Thus, simulation may also be useful in the design process of the measurement/control logic, rather than the system. For example, as the commercial applications of measurement/control systems constantly increase, along with the time-to-market and technical demands for these systems, it becomes more important to be able to test new measurement/control logic prototypes with a minimum of delay. Since coupling these prototypes with a real system may take a significant amount of time, it is often desirable to instead test the prototypes with a simulation of the system. A shorter turnaround time enables more iterations and modifications to the measurement/control logic prototypes, helps ensure a high quality product, and enables new features to be introduced more quickly.

Graphical Programming

Traditionally, high level text-based programming languages have been used by programmers in writing application programs. Many different high level text-based programming languages exist, including BASIC, C, Java, FORTRAN, Pascal, COBOL, ADA, APL, etc. Programs written in these high level text-based languages are translated to the machine language level by translators known as compilers or interpreters. The high level text-based programming languages in this level, as well as the assembly language level, are referred to herein as text-based programming environments.

Increasingly, computers are required to be used and programmed by those who are not highly trained in computer programming techniques. When traditional text-based programming environments are used, the user's programming skills and ability to interact with the computer system often become a limiting factor in the achievement of optimal utilization of the computer system.

There are numerous subtle complexities which a user must master before he can efficiently program a computer system in a text-based environment. The task of programming a computer system to model or implement a process often is further complicated by the fact that a sequence of mathematical formulas, steps or other procedures customarily used to conceptually model a process often does not closely correspond to the traditional text-based programming techniques used to program a computer system to model such a process. In other words, the requirement that a user program in a text-based programming environment places a level of abstraction between the user's conceptualization of the solution and the implementation of a method that accomplishes this solution in a computer program. Thus, a user often must substantially master different skills in order to both conceptualize a problem or process and then to program a computer to implement a solution to the problem or process. Since a user often is not fully proficient in techniques for programming a computer system in a text-based environment to implement his solution, the efficiency with which the computer system can be utilized often is reduced.

To overcome the above shortcomings, various graphical programming environments now exist which allow a user to construct a graphical program or graphical diagram, also referred to as a block diagram. U.S. Pat. Nos. 4,901,221; 4,914,568; 5,291,587; 5,301,301; and 5,301,336; among others, to Kodosky et al disclose a graphical programming environment which enables a user to easily and intuitively create a graphical program. Graphical programming environments such as that disclosed in Kodosky et al can be considered a higher and more intuitive way in which to interact with a computer. A graphically based programming environment can be represented at a level above text-based high level programming languages such as C, Basic, Java, etc.

A user may assemble a graphical program by selecting various icons or nodes which represent desired functionality, and then connecting the nodes together to create the program. The nodes or icons may be connected by lines representing data flow between the nodes, control flow, or execution flow. Thus the block diagram may include a plurality of interconnected icons such that the diagram created graphically displays a procedure or method for accomplishing a certain result, such as manipulating one or more input variables and/or producing one or more output variables. In response to the user constructing a diagram or graphical program using the block diagram editor, data structures and/or program instructions may be automatically constructed which characterize an execution procedure that corresponds to the displayed procedure. The graphical program may be compiled or interpreted by a computer.

A graphical program may have a graphical user interface. For example, in creating a graphical program, a user may create a front panel or user interface panel. The front panel may include various graphical user interface elements or front panel objects, such as user interface controls and/or indicators, that represent or display the respective input and output that will be used by the graphical program, and may include other icons which represent devices being controlled.

Thus, graphical programming has become a powerful tool available to programmers. Graphical programming environments such as the National Instruments LabVIEW product have become very popular. Tools such as LabVIEW have greatly increased the productivity of programmers, and increasing numbers of programmers are using graphical programming environments to develop their software applications. In particular, graphical programming tools are being used for test and measurement, data acquisition, process control, man machine interface (MMI), supervisory control and data acquisition (SCADA) applications, modeling, simulation, image processing/machine vision applications, and motion control, among others.

SUMMARY OF THE INVENTION

One embodiment of the present invention comprises a system and method for performing a simulation of a system, optionally in real time. The system includes a programmable hardware element, such as a Field Programmable Gate Array (FPGA) device, Programmable Logic Device (PLD), or other device that includes reconfigurable or programmable hardware. The programmable hardware element may be configured with simulation logic (a solver), thus allowing a very fast execution of the simulation.

The programmable hardware element may also be configured with a system model. The system model may comprise information that represents the system being simulated. For example, the system model may comprise matrix coefficients stored in memory (RAM) that are loaded into registers on the FPGA. The simulation logic comprises logic for simulating operation of the system under simulation, based on the system model and an input signal received from input hardware coupled to the programmable hardware element. In particular, the simulation logic produces a simulation output signal based on the system model and the input signal, where the simulation output signal is provided to output hardware coupled to the programmable hardware element. The output hardware produces output in response to the simulation output signal. Thus, a human observer may be able to evaluate performance of the system under simulation by analyzing the output produced in response to the simulation output signal.

The system may be reconfigured to simulate different systems simply by changing the system model, e.g., by updating the registers on the FPGA with different matrix coefficients representing a different model. In other words, the simulation logic may comprise "generic" logic for simulating different systems, depending on the particular system model with which the programmable hardware element is configured. The simulation logic may be modularized from the system model so that the programmable hardware element can quickly be reconfigured to simulate a different system model without requiring the programmable hardware element to be reconfigured with different simulation logic. Thus the system described herein may provide for fast execution, using an FPGA-implemented solver, while also being quickly reconfigurable with different system models.

In one particular embodiment, the programmable hardware element may comprise an FPGA device, and the simulation logic may comprise a generic solver, e.g., a time domain solver or a frequency domain solver. The generic solver may be operable to simulate operation of the system under simulation based on equations specified by the system model and input signals received from input hardware coupled to the FPGA device. For example, a generic time domain solver may be operable to periodically generate an output signal for the system under simulation at fixed time steps, where the output signal is generated based on the result of solving the equations, and where the equations are solved based on the input signals from the input hardware. Thus, in one embodiment the system may perform a time domain simulation of the system under simulation.

The generic time domain solver is referred to herein as "generic" because it is operable to perform a time domain simulation of different systems by simply reconfiguring the FPGA device with a different system model. The generic time domain solver may be modularized from the system model so that the FPGA device can easily and quickly be reconfigured with a different system model, without requiring the generic time domain solver to be changed. The logic or solver may comprise an FPGA implementation, e.g., a net list or bit file which is implemented on an FPGA, which requires a large amount of time to replace. In contrast, the system model comprise a plurality of model matrix coefficients that are stored in random access memory (RAM), such as a computer's RAM, and which may be loaded into registers in the FPGA. Thus the solver, which is expensive (in terms of time) to modify or replace, is generic and is preferably stored once on the FPGA, and provides a very fast execution. Thereafter different system models (comprising matrix coefficients stored in RAM) may be loaded into registers of the FPGA in a matter of microseconds. Thus the FPGA-based solver can be easily reconfigured with different system models very quickly and efficiently.

Further, since the FPGA is itself reconfigurable, different solvers can be implemented on the FPGA. For example, where a solver has been pre-compiled, the bit file of the pre-compiled solver can be implemented on the FPGA in the order of tens to hundreds of milliseconds. Where a new solver implementation requires a re-compile, this may take on the order of hours, due to the lengthy re-compile time.

In various embodiments the system may be used to simulate any of various kinds of systems. In other words, the system under simulation may comprise a system of any kind, and thus, the system model may comprise a model of a system of any kind. In general, the system model may model any type of apparatus, process, or condition. The system model may model physical, mechanical, electrical, chemical, thermodynamic, and/or other types of behavior of the system under simulation. As a few illustrative examples, the system model may comprise a model of an electronic circuit or other electronic system, an engine or engine component, an object in motion, a chemical reaction, a petroleum refining process, a room maintained at a setpoint temperature, a system of liquids flowing among different tanks, etc.

In one embodiment a computer system may couple to the FPGA device or other programmable hardware element. The computer system may execute software for creating a representation of the system under simulation and automatically converting the representation to a system model for deployment to the FPGA device or other programmable hardware element. As noted above, the system model may comprise one or more data structures, e.g., a plurality of model matrix coefficients.

The system described above may enable simulations of many types of systems to be performed, optionally in real time. By configuring the FPGA device or other programmable hardware element to implement the simulation, the simulation may proceed much faster than if the simulation were performed in software executing on a computer system. Also, the simulation of the system may be performed using real-world input hardware and output hardware. In other words, the simulation may be performed using the same input/output hardware that would be used together with an actual physical implementation of the system being modeled, where little or no modification is required to the input/output hardware. Moreover, the system model may be quickly and easily changed, which can enable users to ascertain and understand the effects of various modifications to the system under simulation.

BRIEF DESCRIPTION OF THE DRAWINGS

A better understanding of the present invention can be obtained when the following detailed description of the preferred embodiment is considered in conjunction with the following drawings, in which.

Figure 1A:
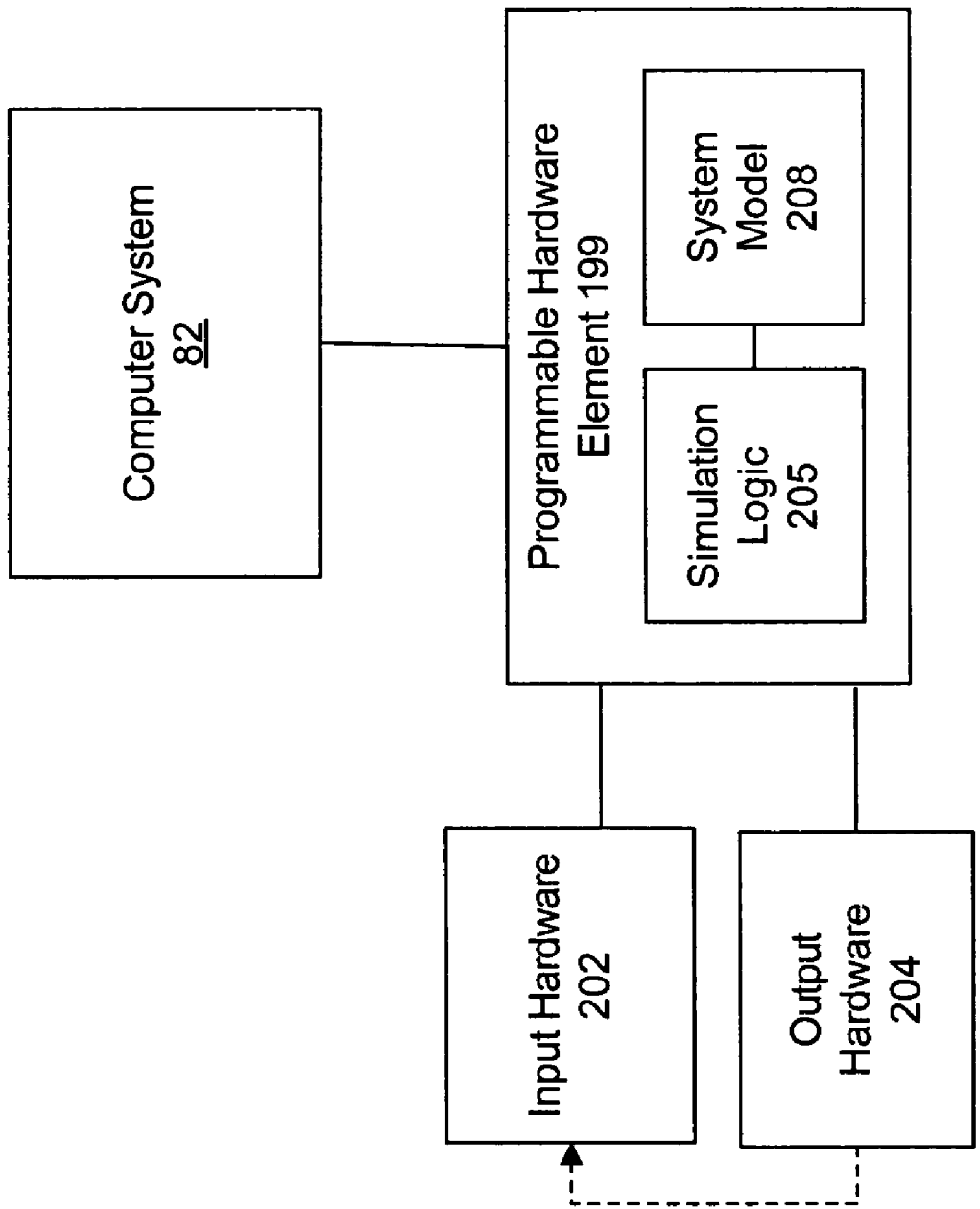
FIGS. 1A and 1B illustrate embodiments of a system for performing a real-time simulation of a system.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Incorporation by Reference

The following references are hereby incorporated by reference in their entirety as though fully and completely set forth herein:

U.S. Pat. No. 5,481,741: titled "Method and Apparatus for Providing Attribute Nodes in a Graphical Data Flow Environment".

U.S. Pat. No. 6,173,438: titled "Embedded Graphical Programming System" filed Aug. 18, 1997.

U.S. Pat. No. 6,219,628: titled "System and Method for Configuring an Instrument to Perform Measurement Functions Utilizing Conversion of Graphical Programs into Hardware Implementations," filed Aug. 18, 1997.

U.S. Patent Application Publication No. 20010020291: (Ser. No. 09/745,023) titled "System and Method for Programmatically Generating a Graphical Program in Response to Program Information," filed Dec. 20, 2000.

U.S. patent application Ser. No. 10/046,861: titled, "System and Method for Performing a Hardware in the Loop Simulation Using a Plurality of Graphical Programs that Share a Single Graphical User Interface," filed Jan. 15, 2002.

U.S. patent application Ser. No. 10/892,829: titled, "A Graphical Program Which Executes a Timed Loop," filed Jul. 16, 2004.

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as signals such as electrical, electromagnetic, or digital signals, conveyed via a communication medium such as a bus, network and/or a wireless link.

Programmable Hardware Element—includes various types of programmable hardware, reconfigurable hardware, programmable logic, or field-programmable devices (FPDs), such as one or more FPGAs (Field Programmable Gate Arrays), or one or more PLDs (Programmable Logic Devices), such as one or more Simple PLDs (SPLDs) or one or more Complex PLDs (CPLDs), or other types of programmable hardware. A programmable hardware element may also be referred to as "reconfigurable logic".

Medium—includes one or more of a memory medium, carrier medium, and/or programmable hardware element; encompasses various types of mediums that can either store program instructions/data structures or can be configured with a hardware configuration program. For example, a medium that is "configured to perform a function or implement a software object" may be 1) a memory medium or carrier medium that stores program instructions, such that the program instructions are executable by a processor to perform the function or implement the software object; 2) a medium carrying signals that are involved with performing the function or implementing the software object; and/or 3) a programmable hardware element configured with a hardware configuration program to perform the function or implement the software object.

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, Pascal, Fortran, Cobol, Java, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element.

Graphical Program—A program comprising a plurality of interconnected nodes or icons, wherein the plurality of interconnected nodes or icons visually indicate functionality of the program.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW, DasyLab, DiaDem and Matrixx/SystemBuild from National Instruments, Simulink from the MathWorks, VEE from Agilent, WiT from Coreco, Vision Program Manager from PPT Vision, SoftWIRE from Measurement Computing, Sanscript from Northwoods Software, Khoros from Khoral Research, SnapMaster from HEM Data, VisSim from Visual Solutions, ObjectBench by SES (Scientific and Engineering Software), and VisiDAQ from Advantech, among others.

The term "graphical program" includes models or block diagrams created in graphical modeling environments, wherein the model or block diagram comprises interconnected nodes or icons that visually indicate operation of the model or block diagram; exemplary graphical modeling environments include Simulink, SystemBuild, VisSim, Hypersignal Block Diagram, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected nodes are often referred to as the block diagram portion of the graphical program.

Node—In the context of a graphical program, an element that may be included in a graphical program. A node may have an associated icon that represents the node in the graphical program, as well as underlying code or data that implements functionality of the node. Exemplary nodes include function nodes, terminal nodes, structure nodes, etc. Nodes may be connected together in a graphical program by connection icons or wires.

Data Flow Graphical Program (or Data Flow Diagram)—A graphical program or diagram comprising a plurality of interconnected nodes, wherein the connections between the nodes indicate that data produced by one node is used by another node.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators Input Control—a graphical user interface element for providing user input to a program. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "icomputer system" can be broadly defined to encompass any device (or combination of devices) having at least one processor that executes instructions from a memory medium.

Measurement Device—includes instruments, data acquisition devices, smart sensors, and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

Referring now to FIG. 1A, one embodiment of a system for performing a simulation of a system is illustrated. The simulation may optionally be performed in real-time, i.e., may be performed in a manner where the simulation can respond to real world signals. FIG. 1A illustrates a programmable hardware element 199. In various embodiments the programmable hardware element 199 may comprise a programmable hardware element such as a Field Programmable Gate Array (FPGA) device, Programmable Logic Device (PLD), or other device that includes reconfigurable or programmable hardware.

The programmable hardware element 199 has been configured with simulation logic (e.g., a solver) 205. For example, a hardware configuration program may be used to configure the programmable hardware element 199 with the simulation logic 205. Implementation of a solver on the programmable hardware element 199 allows for very fast execution.

The programmable hardware element 199 has also been configured with a system model 208, comprising information that represents the system under simulation. The simulation logic 205 comprises logic for simulating operation of the system under simulation, based on the system model 208 and an input signal received from the input hardware 202 that is coupled to the programmable hardware element 199. In particular, the simulation logic 205 produces a simulation output signal based on the system model 208 and the input signal, where the simulation output signal is provided to the output hardware 204. The output hardware 204 produces output in response to the simulation output signal. Thus, a human observer may be able to evaluate performance of the system under simulation by analyzing the output produced in response to the simulation output signal.

The system of FIG. 1A may be reconfigured to simulate different systems simply by changing the system model 208. In other words, the simulation logic 205 may comprise "generic" logic (e.g., a generic solver) for simulating different systems, depending on the particular system model 208 with which the programmable hardware element 199 is configured. The simulation logic 205 may be modularized from the system model 208 so that the programmable hardware element 199 can quickly be reconfigured with a different system model 208 without requiring the programmable hardware element 199 to be reconfigured with different simulation logic 205.

More particularly, the generic solver may be implemented on the FPGA 199 from a net list or bit file. It generally takes a long time (many hours) to recompile a net list or bit file for placement on an FPGA 199, and hence the solver implemented on the FPGA 199 is designed to be generic to many system models. Thus the solver on the FPGA 199 does not have to be changed or modified very often, if at all. The system model is preferably implemented as a plurality of matrix coefficients stored in computer memory (RAM), where the matrix coefficients may represent a set of equations. Thus a system model may be loaded onto the FPGA 199 in a very short time (e.g., microseconds). Thus different system models may be stored on and simulated by the FPGA without requiring expensive re-compiles of the net list implementing the solver.

Figure 1B:
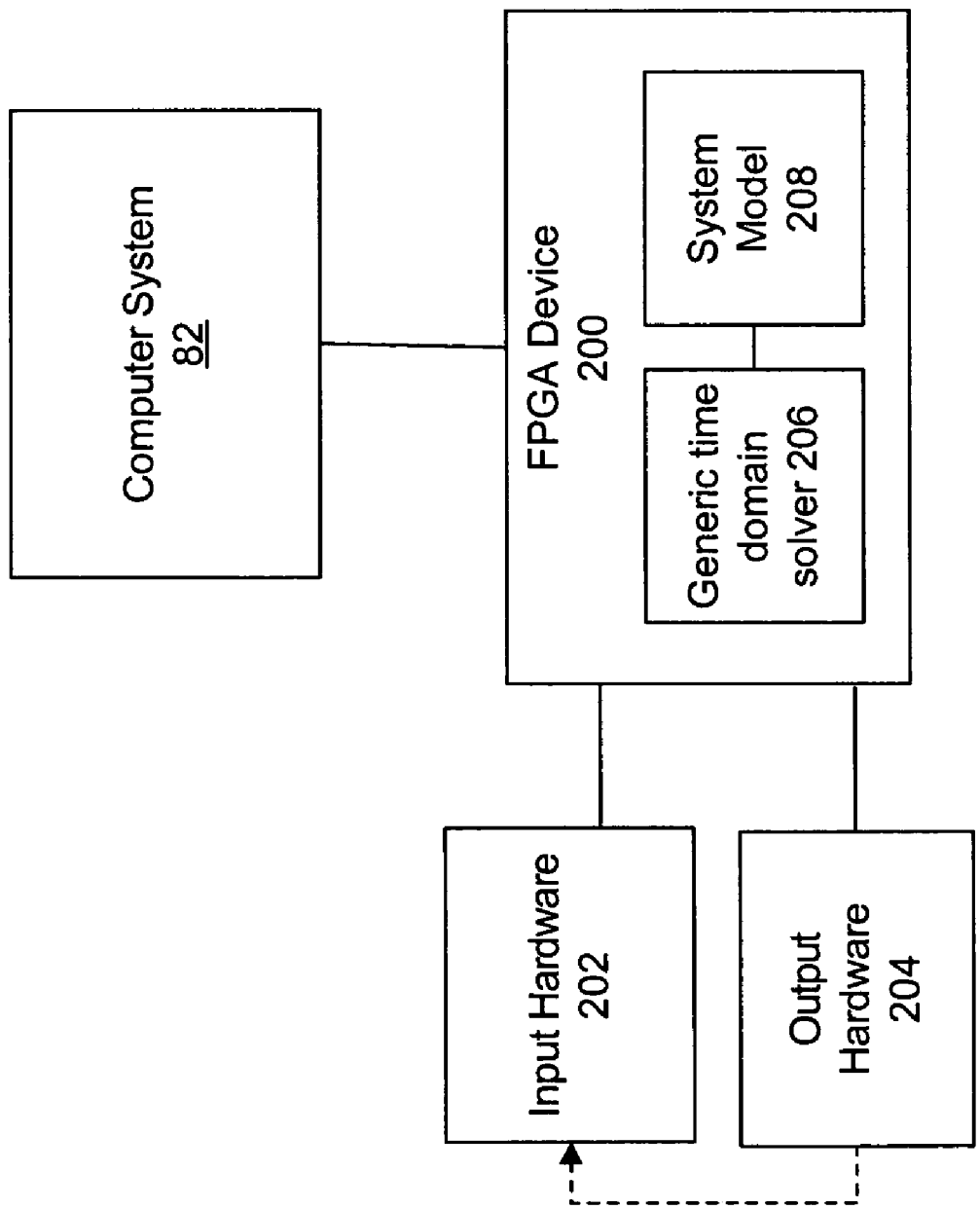

FIG. 1B illustrates a more particular embodiment of the system of FIG. 1A. In this embodiment the programmable hardware element 199 comprises an FPGA device 200, and the simulation logic 205 comprises a generic time domain solver 206. In this embodiment the system model 208 may comprise information specifying a set of equations that represent behavior of the system under simulation. The generic time domain solver 206 may comprise logic for solving the set of equations based on the input signal received from the input hardware 202. For example, the generic time domain solver 206 may be operable to periodically generate an output signal for the system under simulation at fixed time steps, where the output signal is generated based on the result of solving the equations, and where the equations are solved based on the input signal. Thus, the system of FIG. 1B may perform a time domain simulation of the system under simulation. The output hardware 204 may receive the output signal from the FPGA device 200 and produce output in response to the output signal, which may be analyzed to evaluate performance of the system under simulation.

The generic time domain solver 206 is referred to herein as "generic" because it is operable to perform a time domain simulation of different systems by simply reconfiguring the FPGA device 200 with a different system model 208 (e.g., by simply loading different sets of matrix coefficients from RAM into the memory of the FPGA). In one embodiment, the generic time domain solver 206 may be operable to perform a time domain simulation for any system model 208, within certain resource constraints. In the preferred embodiment the generic time domain solver 206 is modularized from the system model 208 so that the FPGA device 200 can easily and quickly be reconfigured with a different system model 208, without requiring the generic time domain solver 206 to be changed. For example, the FPGA device 200 may be configured with logic representing the generic time domain solver 206, which may include registers or other memory for storing data. Information representing a particular system model 208, e.g., model matrix coefficients, may simply be stored in the registers on the FPGA 200, and then the simulation may begin. Different system models 208 may be loaded into the memory of the FPGA 200, without requiring the generic time domain solver 206 to be re-configured. In other words, the generic time domain solver 206 operates in a generic manner so that it is able to perform a time domain simulation for any system model 208.

In one embodiment the system model 208 may be limited to a maximum number of nodes so as not to exceed the capacity of the FPGA. For example, the system model 208 may be limited to a maximum number of nodes so as: 1) not to exceed the capacity (slices) of the FPGA; or 2) not to slow down the simulation too much (e.g., resulting in a loss of real time performance); or 3) not to exceed the memory size on the FPGA. For example, where the system under simulation is an electronic circuit, the circuit may be limited to a maximum number of nodes. Also, in one embodiment the generic time domain solver 206 may be limited to performing simulations of linear systems, i.e., systems that can be modeled by a set of linear equations. Linear systems typically require significantly fewer resources to simulate than non-linear systems.

It is noted that, given a maximum number of nodes the 'complexity' of the solver may be fixed but the implementation can be more or less parallelized/serialized. Some different possible scenarios are:

no serialization: The simulation is very fast (good for real time) but will be restricted to a specific maximum number of nodes that, if exceeded, would require either too many slices or too many multipliers.

Some serialization: The simulation is slower (weakening real time requirements) but allows more nodes because of shared slices and shared multipliers.

The limit of serialization is hit when it is becoming too slow or the number of nodes requires too many slices and/or RAM to be managed.

In various embodiments the system of FIG. 1A or 1B may be used to simulate any of various kinds of systems. In other words, the system under simulation may comprise a system of any kind, and thus, the system model 208 may comprise a model of a system of any kind. In general, the system model 208 may model any type of apparatus, process, or condition. The system model 208 may model physical, mechanical, electrical, chemical, thermodynamic, and/or other types of behavior of the system under simulation. As a few illustrative examples, the system model 208 may comprise a model of an electronic circuit or other electronic system, an engine or engine component, an object in motion, a chemical reaction, a petroleum refining process, a room maintained at a setpoint temperature, a system of liquids flowing among different tanks, etc.

As noted above, in one embodiment the system model 208 may comprise information specifying a set of equations representing behavior of the system under simulation. In other embodiments the system model may comprise various other kinds of information representing behavior of the system under simulation.

Thus, as noted above, configuring the programmable hardware element 199 (e.g., FPGA device 200) with the system model 208 may comprise configuring the programmable hardware element 199 with simple parameters, e.g., numeric parameters. For example, in one embodiment the system model 208 may comprise a set of numeric matrix coefficients, where the matrix coefficients specify a set of equations representing behavior of the system under simulation. In this embodiment, configuring the programmable hardware element 199 with the system model 208 may comprise storing the set of matrix coefficients in the programmable hardware element 199.

The system model 208 may comprise information in any of various formats suitable for configuring the programmable hardware element 199, e.g., depending on the type of the programmable hardware element 199. For example, the system model 208 may be formatted as a hardware configuration program for configuring the programmable hardware element 199 with the system model 208. For example, in one embodiment the system model 208 may comprise a netlist operable to configure gates or other elements of an FPGA device 200.

In one embodiment a user may create a representation of the system under simulation in one format, and this representation may then be programmatically or automatically converted to another format (e.g., a netlist or other hardware configuration program) to obtain a system model 208 suitable for deployment on the programmable hardware element 199.

For example, as described below, in one embodiment the user may create a diagram representing the system under simulation, and the diagram may then be automatically converted to another format to obtain the system model 208 for configuring the programmable hardware element 199.

The input hardware 202 may comprise any kind of hardware device(s) operable to provide any kind of input signals to the FPGA device 200 (or other programmable hardware element 199), e.g., depending on what kind of system is under simulation. Similarly, the output hardware 204 may comprise any kind of hardware device(s) operable to receive output signals from the FPGA device 200, e.g., depending on what kind of system is under simulation.

As one simple example, consider a system model 208 of a circuit design for filtering audio signals, e.g., to eliminate certain frequencies. Thus, the system model 208 represents functionality of the filtering circuit, w ithout requiring an actual physical implementation of the filtering circuit to exist. In this example, the input hardware 202 may comprise a sound card, stereo system, or other hardware device operable to generate an audio signal, and may also comprise an analog-to-digital converter to convert the audio signal to a digital signal for input to the FPGA device 200 of FIG. 1B. The generic time domain solver 206 in the FPGA device 200 may receive the audio input signal as input and compute an audio output signal based on the audio input signal and the system model 208 of the filtering circuit. In other words, for each time segment of the audio input signal, the generic time domain solver 206 may simulate operation of the filtering circuit to produce a corresponding output signal identical to the output signal that would be produced if the audio input signal were filtered through an actual physical implementation of the filtering circuit. The output signal computed by the generic time domain solver 206 may then be passed to output hardware 204, such as a digital-to-analog converter and one or more audio speakers.

In the audio filtering circuit example described above, the output hardware 204 does not provide feedback to the input hardware 202. In other embodiments, the output hardware 204 may provide feedback to the input hardware 202, thus forming a feedback loop, as indicated by the broken arrows in FIGS. 1A and 1B. Thus, in some embodiments the output signal(s) from the simulation may influence the input signal(s) to the simulation, thus forming a feedback loop. For example, consider a system model 208 for modeling behavior of a system of tanks and valves that control the flow of liquid. In this example, the input hardware 202 may comprise one or more actuators for opening and closing the valves, and the output hardware 204 may comprise one or more sensors for sensing liquid levels in the tanks. The generic time domain solver 206 may simulate operation of the tanks and valves, based on input signals from the actuators, and may produce output signals representing the simulated liquid levels. The output signals may be passed to the sensors. The sensors may be coupled to a process control unit that provides feedback to the actuators based on the (simulated) liquid levels. The feedback from the sensors and the process control unit can affect the output signals generated by the actuators, thus affecting input to the simulated tank and valve system, so that a process control loop is formed.

As illustrated in FIGS. 1A and 1B, in one embodiment a computer system 82 may couple to the FPGA device 200 or other programmable hardware element 199. In one embodiment the computer system 82 may couple to the FPGA device 200 or other programmable hardware element 199 via a network, such as a LAN (e.g., Ethernet network or other local area network), a WAN (e.g., the Internet or an Intranet), a wireless network, etc. In another embodiment the FPGA device 200 or other programmable hardware element 199 may be coupled to the computer system 82 via an expansion slot of the computer system 82 or via any of various other kinds of interfaces. As described in detail below, in one embodiment the computer system 82 may execute software for creating a system model 208 of a system under simulation and deploying the system model 208 to the FPGA device 200 or other programmable hardware element 199.

The system illustrated in FIGS. 1A or 1B may enable simulations of many types of systems to be performed in real time. By configuring the FPGA device 200 or other programmable hardware element 199 to perform the simulation, the simulation may proceed much faster than if the simulation were performed in software executing on a computer system. Also, the simulation of the system may be performed using real-world input hardware 202 and output hardware 204. In other words, the simulation may be performed using the same input/output hardware that would be used together with an actual physical implementation of the system being modeled, where little or no modification is required to the input/output hardware. Moreover, the system model 208 may be quickly and easily changed, which can enable users to ascertain and understand the effects of various modifications to the system under simulation, as described in more detail below.

It is noted that FIGS. 1A and 1B represent exemplary embodiments of a system for performing a real-time simulation of a system, and numerous alternative embodiments are contemplated. For example, in one alternative embodiment the FPGA device 200 or other programmable hardware element 199 may be configured to implement a generic frequency domain solver instead of a generic time domain solver, so that the system performs a frequency domain response simulation of the system under simulation.

The remainder of the disclosure refers to the embodiment of the system shown in FIG. 1B. It is to be understood however, that in other embodiments the features described below may be implemented in a system that uses a programmable hardware element 199 other than an FPGA device 200, and/or where the FPGA device 200 or other programmable hardware element 199 is configured with simulation logic 205 other than a generic time domain solver 206.

Figure 2:
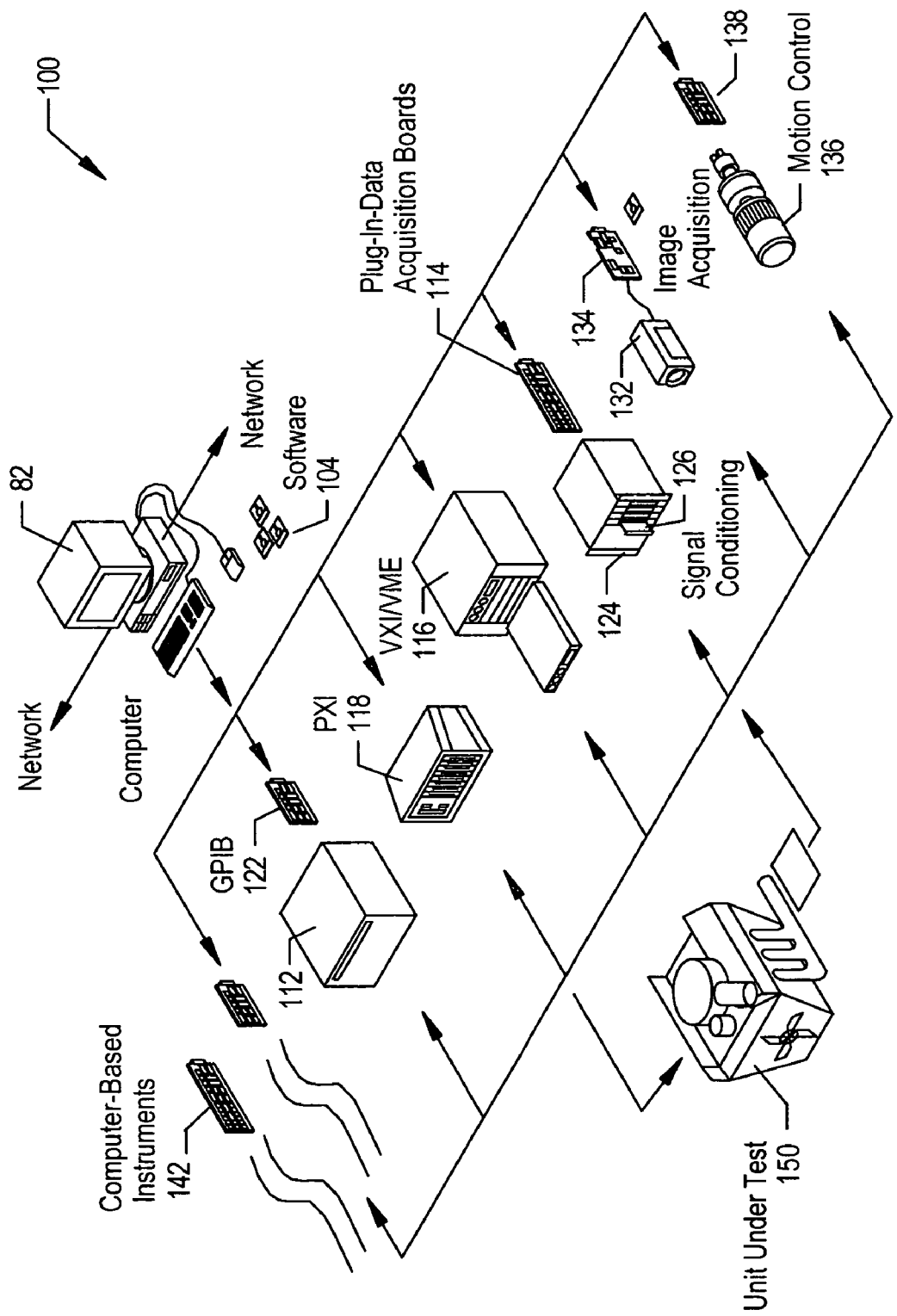
FIG. 2 illustrates an exemplary instrumentation control system in which a host computer connects to one or more instruments.

FIG. 2—Computer System Coupled to Input/Output Hardware

As discussed above, in various embodiments the FPGA device 200. may be coupled to any kind of input hardware 202 and/or output hardware 204. In one embodiment the input hardware 202 and/or the output hardware 204 coupled to the FPGA device 200 may also be coupled to the computer system 82.

FIG. 2 illustrates an exemplary instrumentation control system 100 in which a host computer 82 connects to one or more instruments. The host computer 82 may comprise a CPU, a display screen, memory, and one or more input devices such as a mouse or keyboard as shown. For example, the computer 82 may operate with the one or more instruments to analyze, measure or control a unit under test (UUT) or process 150. In one embodiment, one or more of the instruments shown in FIG. 2 may also be coupled to the FPGA device 200.

The one or more instruments may include a GPIB instrument 112 and associated GPIB interface card 122, a data acquisition board 114 and associated signal conditioning circuitry 124, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices.

The GPIB instrument 112 may be coupled to the computer 82 via the GPIB interface card 122 provided by the computer 82. In a similar manner, the video device 132 may be coupled to the computer 82 via the image acquisition card 134, and the motion control device 136 may be coupled to the computer 82 through the motion control interface card 138. The data acquisition board 114 may be coupled to the computer 82, and may interface through signal conditioning circuitry 124 to the UUT. The signal conditioning circuitry 124 may comprise an SCXI (Signal Conditioning eXtensions for Instrumentation) chassis comprising one or more SCXI modules 126.

The GPIB card 122, the image acquisition card 134, the motion control interface card 138, and the DAQ card 114 are typically plugged in to an I/O slot in the computer 82, such as a PCI bus slot, a PC Card slot, or an ISA, EISA or Micro-Channel bus slot provided by the computer 82. However, these cards 122, 134, 138 and 114 are shown external to computer 82 for illustrative purposes. These devices may also be connected to the computer 82 through a serial bus or through other means.

The VXI chassis or instrument 116 may be coupled to the computer 82 via a VXI bus, MXI bus, or other serial or parallel bus provided by the computer 82. The computer 82 may include VXI interface logic, such as a VXI, MXI or GPIB interface card (not shown), which interfaces to the VXI chassis 116. The PXI chassis or instrument may be coupled to the computer 82 through the computer's PCI bus.

A serial instrument (not shown) may also be coupled to the computer 82 through a serial port, such as an RS-232: port, USB (Universal Serial bus) or IEEE 1394: or 1394.2 bus, provided by the computer 82. In typical instrumentation control systems an instrument will not be present of each interface type, and in fact many systems may only have one or more instruments of a single interface type, such as only GPIB instruments.

The instruments may be coupled to a unit under test (UUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application.

In one embodiment, one or more of the various instruments illustrated in FIG. 2 may couple to the computer 82 over a network, such as the Internet, an Ethernet network, or other wired or wireless network connection.

Figure 3:
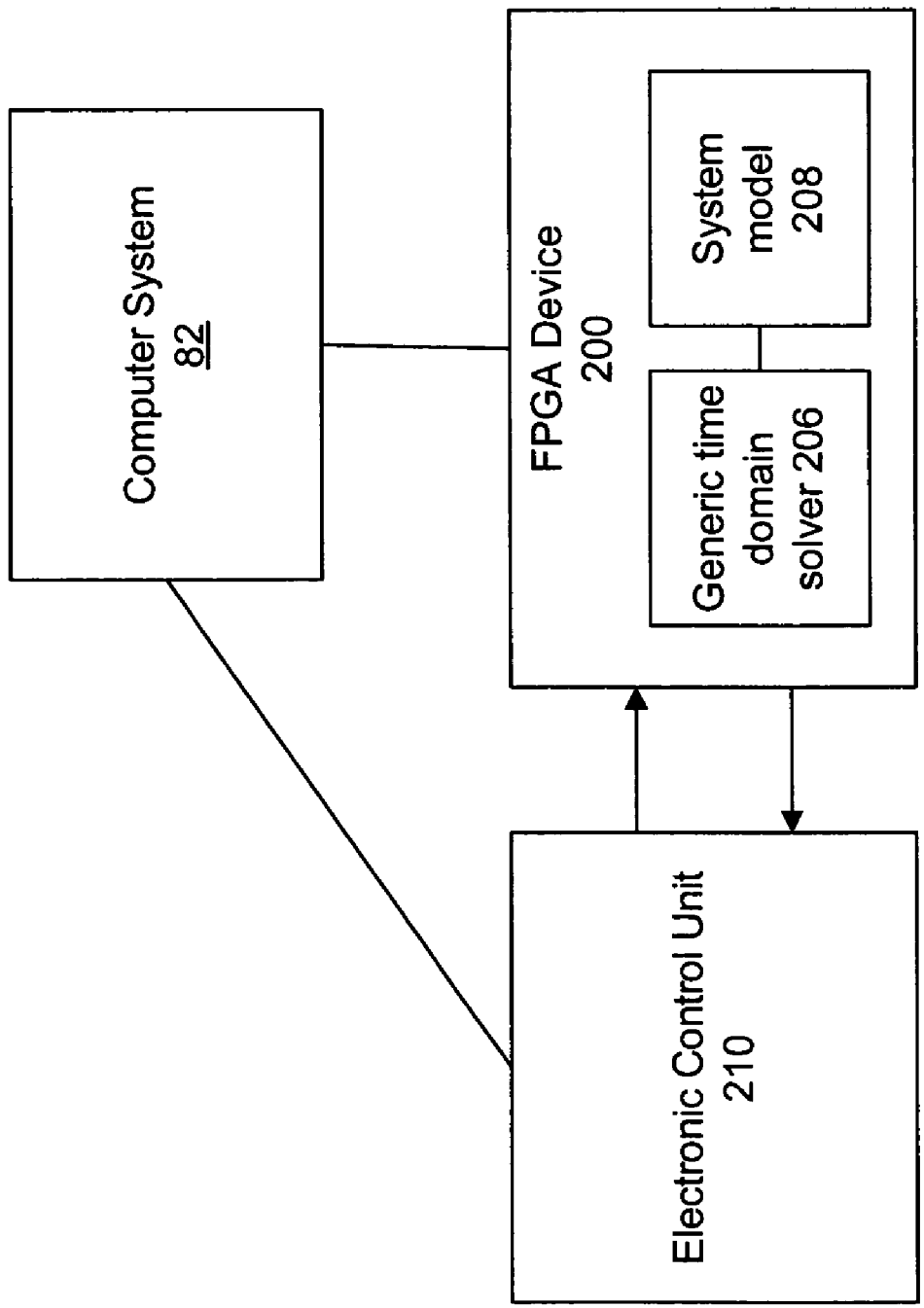
FIG. 3 illustrates one exemplary embodiment of the system of FIG. 1B, in which an electronic control unit is tested in a hardware-in-the-loop simulation.

FIG. 3—Hardware in the Loop Simulation

A system such as shown in FIG. 1A or 1B may be used to perform any of various kinds of simulations, for any of various purposes. As one example, the system may be utilized to perform a "hardware-in-the-loop" simulation. In a hardware-in-the-loop simulation, a real physical implementation of a product may be used in conjunction with a simulated system. For example, consider a control unit designed to control a physical system. It may be impractical to test the control unit with the real physical system that the control unit is designed to control. For example, the tests may be too expensive, too dangerous, or impossible, e.g., the real physical system may not exist yet. Thus, it may be desirable to couple the real control unit to a simulated physical system to perform the tests. As one example, consider an electronic control unit designed to control the braking system of an automobile. It may be desirable to test how the braking system responds in a crash situation. By performing a hardware-in-the-loop simulation, the crash situation can be simulated without actually crashing a real automobile.

FIG. 3 illustrates one exemplary embodiment of the system of FIG. 1B, in which an electronic control unit 210 is tested in a hardware-in-the-loop simulation. The FPGA device 200 is configured to implement a generic time domain solver 206, as described above. Suppose that the electronic control unit 210 is designed to control the braking system of an automobile. Thus, the system model 208 comprises a model of the braking system. In this example, the electronic control unit 210 acts as both input hardware providing input signals to the FPGA device 200 (e.g., representing control signals to increase or decrease braking) and output hardware receiving output signals from the FPGA device 200 (e.g., representing various output measurements of the simulated braking system).

Although a hardware-in-the-loop simulation can be performed by simulating the physical system in software, the resulting simulation is often too slow to be performed in real time. By simulating the physical system (e.g., the braking system in the example above) on the FPGA device 200, the simulation may be performed in real time so that the behavior of the real physical system is closely approximated.

In the example of FIG. 3, the computer system 82 is also shown as being coupled to the electronic control unit 210. For example, in one embodiment the computer system 82 may execute a measurement program for measuring characteristics of the electronic control unit 210. For example, the measurement program may be utilized to gather information that can be analyzed to determine how well the electronic control unit 210 is performing. In one embodiment the measurement program executed by the computer system 82 may comprise a graphical program, i.e., a program whose functionality is specified by a plurality of interconnected nodes. In one embodiment the computer system 82 may execute a real-time operating system allowing the measurement. program to perform measurements in a loop at a precise rate and with a minimal amount of jitter.

Figure 4:
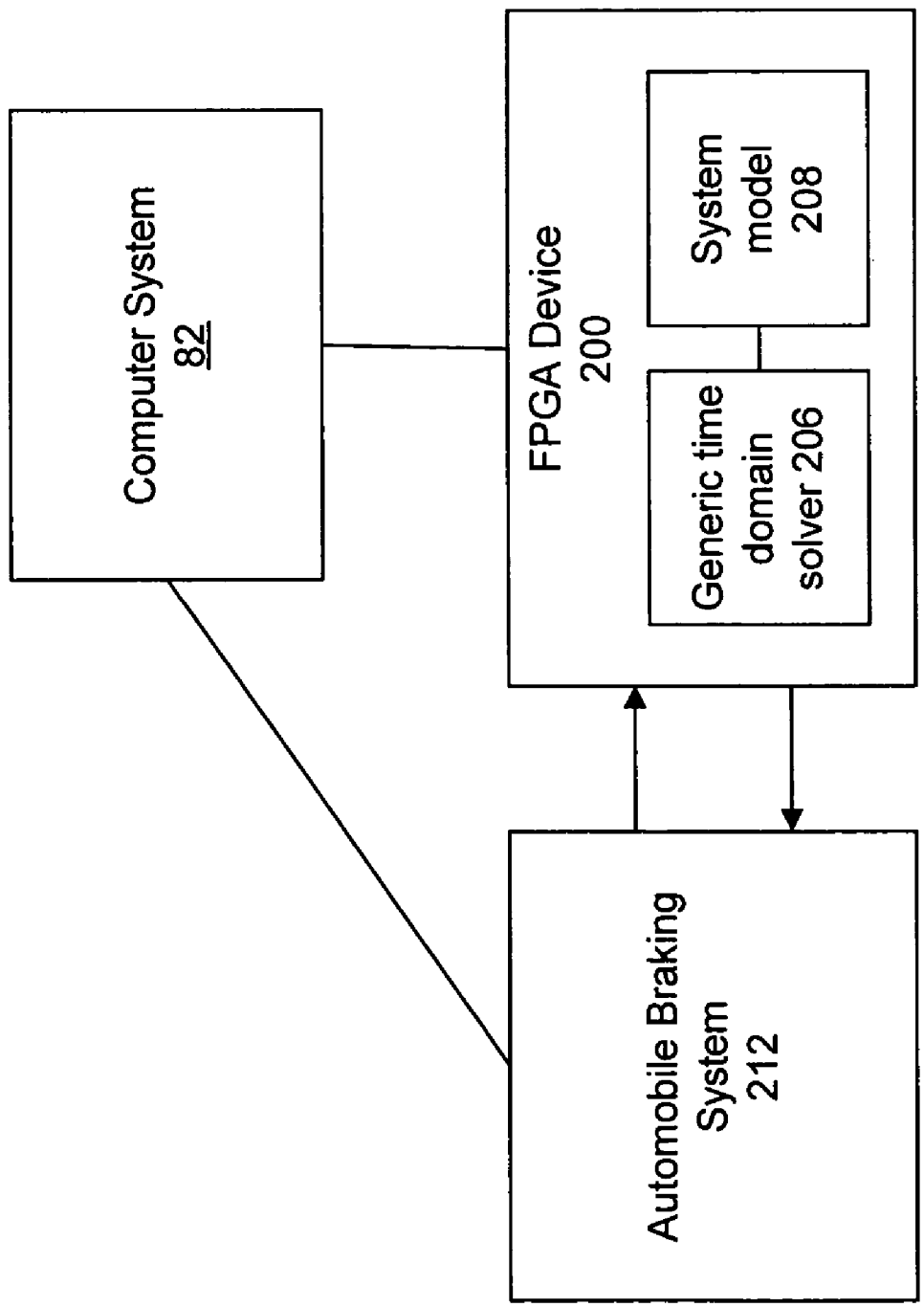
FIG. 4 illustrates another exemplary embodiment of the system of FIG. 1B, in which a prototype of an electronic control unit for controlling the braking system of an automobile is tested.

FIG. 4—Rapid Control Prototyping Simulation

In another embodiment, a system such as shown in FIG. 1A or 1B may be utilized to perform a "rapid control prototyping (RCP)" simulation. A goal of rapid control prototyping is to enable product designs to be tested in real-time simulations, e.g., before the design of the product has been finalized and before the product has actually gone into production. FIG. 4 illustrates one exemplary embodiment of the system of FIG. 1B, in which a prototype of an electronic control unit for controlling the braking system of an automobile is tested. The FPGA device 200 is configured to implement a generic time domain solver 206, as described above. In this example, the system model 208 comprises a model of the electronic control unit, e.g., a model of the circuitry that implements the control algorithm for controlling the braking system.

The FPGA device 200 is coupled to a real physical automobile braking system 212. The simulated electronic control unit implemented by the FPGA device 200 may control the braking system 212 much the same as a production electronic control unit would. However, the process of deploying and testing simulated control circuitry on the FPGA device 200 as a system model 208 may be much easier and quicker than producing a physical implementation of the control circuitry. Also, the design of the control circuitry may be quickly changed and re-deployed on the FPGA device 200 as a new system model 208, allowing different versions of the braking control algorithms to be easily tested. Thus, the design/test process may be a very tightly closed loop, allowing designs to be quickly and easily tested and significantly speeding up the product development process.

Figure 5:
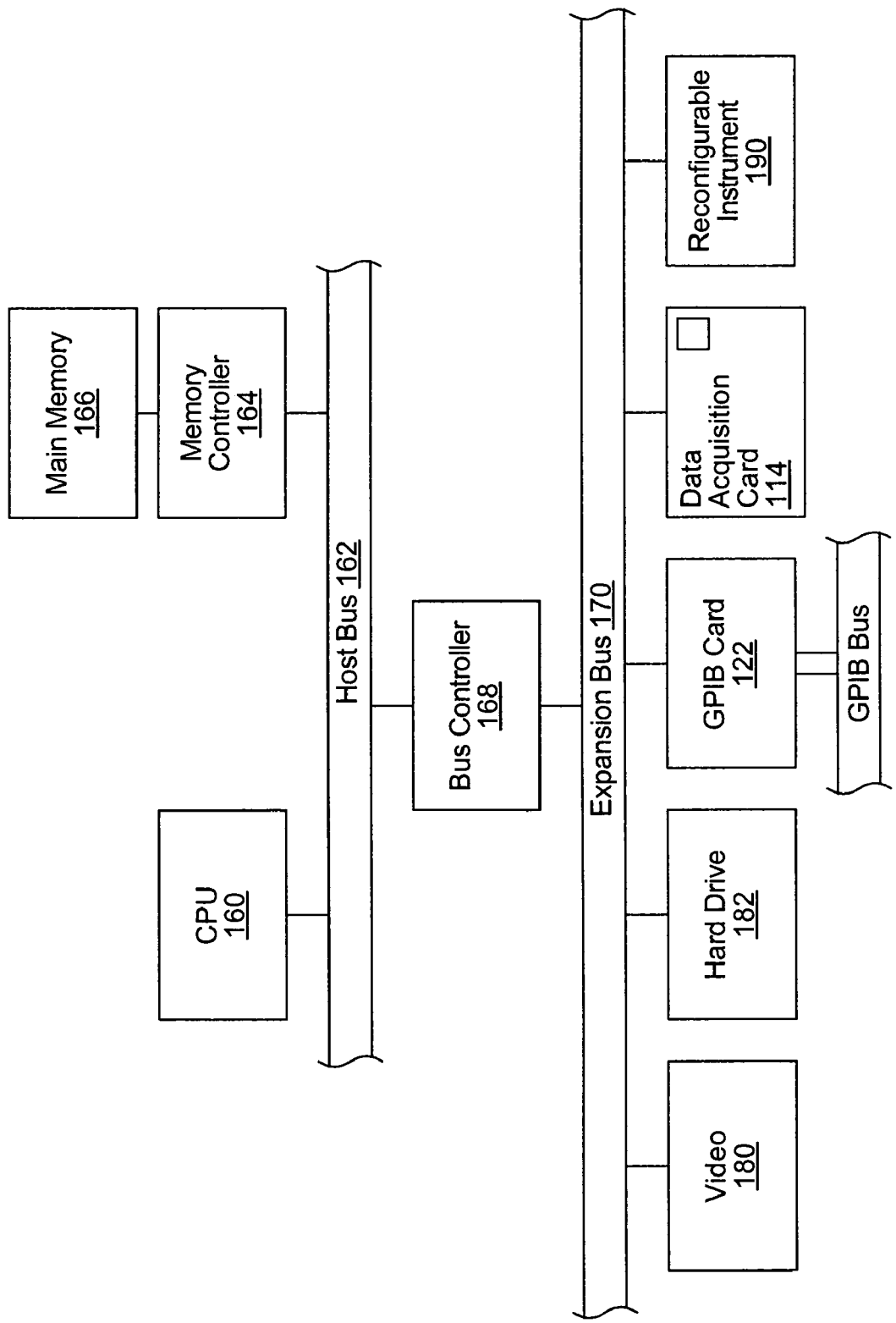
FIG. 5 is a block diagram representing one embodiment of the computer system 82 illustrated in FIGS. 1-4.

FIG. 5—Computer System Block Diagram

FIG. 5 is a block diagram representing one embodiment of the computer system 82 illustrated in FIGS. 1-4. It is noted that any type of computer system configuration or architecture can be used as desired, and FIG. 5 illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170.

As shown, a device 190 may also be connected to the computer. The device 190 may include a processor and memory which may execute a real time operating system. The device 190 may also or instead comprise a programmable hardware element. For example, in one embodiment the device 190 may include the FPGA device 200 that is configured to simulate a system. In one embodiment the computer system 82 may be operable to deploy a system model 208 to the device 190 for simulation on the FPGA device 200. In other embodiments the FPGA device 200 may be coupled to the computer system 82 using other techniques, e.g., via a network, as noted above.

In one embodiment the main memory 166 may store software operable to create a representation of the system under simulation in response to user input. In one embodiment this representation may be deployed directly as the system model 208 to the FPGA device 200. In another embodiment, software in the main memory 166 may be operable to first automatically convert the representation of the system under simulation specified by the user to one or more other formats to produce a system model 208 to be deployed on the FPGA device 200. The main memory 166 may also store software operable to deploy the system model 208 to the FPGA device, as well as perform various other functions, as described below. The main memory 166 may also store operating system software, as well as other software for operation of the computer system.

Figure 6:
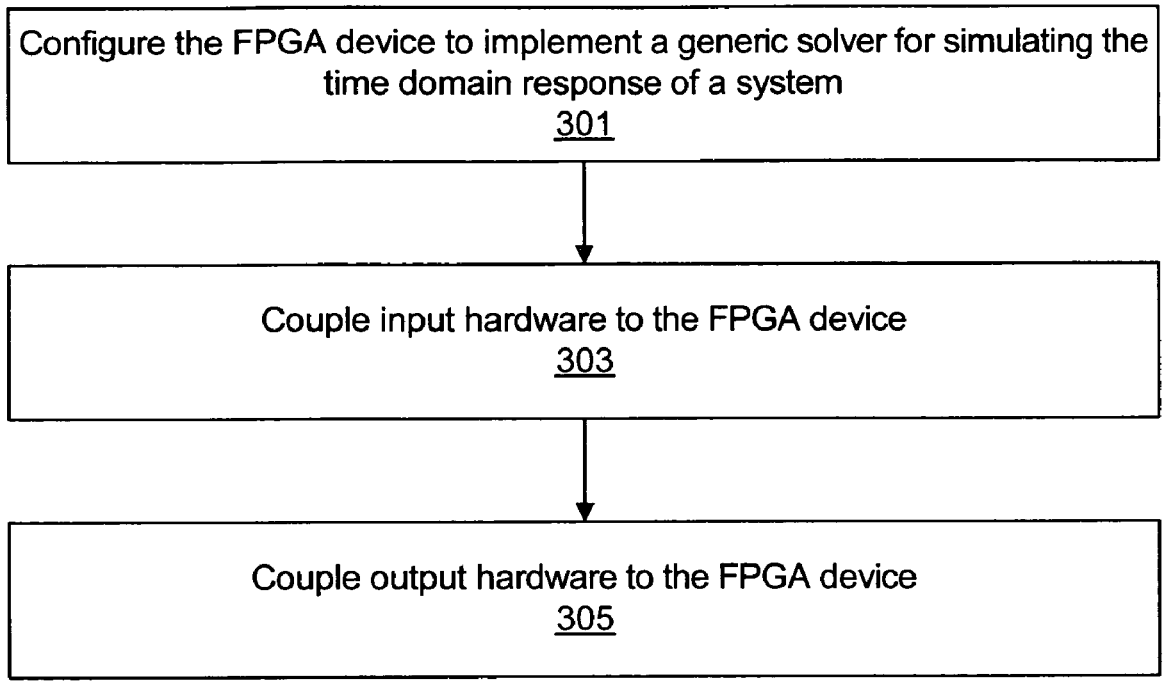
FIG. 6 is a flowchart diagram illustrating one embodiment of a method for configuring the system of FIG. 1B.

FIG. 6 is a flowchart diagram illustrating one embodiment of a method for configuring the system of FIG. 1B. It is noted that FIG. 6 illustrates a representative embodiment, and alternative embodiments are contemplated. Also, various elements may be combined, omitted, or performed in different orders.

In 301, the FPGA device 200 is configured to implement a generic solver for simulating the time domain response of a system, i.e., is configured to implement the generic time domain solver 206. In other words, gates or other elements of the FPGA device 200 may be configured so that the FPGA is operable to implement logic for performing a time domain response simulation of a system under simulation, where the system under simulation is represented by a system model 208 that specifies a set of equations, as described above. For example, a netlist or hardware configuration program representing the generic time domain solver 206 may be used to configure the FPGA device 200. An FPGA device 200 that has been configured to implement a generic solver is also referred to herein as an "FPGA-based solver".

In one embodiment the netlist or hardware configuration program representing the generic time domain solver 206 may be automatically generated from a software program. For example, a user may write a software program that defines the logic of the generic time domain solver 206, and the program may then be deployed on the FPGA device by first converting the program to the netlist. In one embodiment the netlist may be automatically generated based on a graphical software program. An exemplary graphical software program that defines the logic of an exemplary generic time domain solver is described below.

In 303, the input hardware 202 is coupled to the FPGA device 200. As discussed above, the input hardware 202 may comprise any kind of hardware device(s) operable to provide any kind of input signals to the FPGA device 200, e.g., depending on what kind of system is under simulation. In one embodiment, the FPGA device 200 may receive an input signal from an analog-to-digital converter, where the analog-to-digital converter converts an analog signal from another device to a digital signal.

In 305, the output hardware 204 is coupled to the FPGA device 200. As discussed above, the output hardware 202 may comprise any kind of hardware device(s) operable to receive any kind of output signals from the FPGA device 200, e.g., depending on what kind of system is under simulation. In one embodiment, the FPGA device 200 may provide an output signal to a digital-to-analog converter, where the digital-to-analog converter converts a digital signal from the FPGA device 200 to an analog signal which is then provided to another device.

In one embodiment the input hardware 202 and the output hardware 204 may comprise different sub-devices within a larger device. For example, the input hardware 202 may comprise an output port of a device, wherein the output port is operable to provide an output signal as the input signal to the FPGA device 200. Similarly, the output hardware 204 may comprise an input port of the device, wherein the input port is operable to receive as input the output signal produced by the FPGA device 200. Thus, the system may form a feedback loop.

Once the system has been configured as shown in FIG. 6, the FPGA device may then be configured with a specific system model 208 to perform a simulation of a specific system under simulation, as described below.

Figure 7:
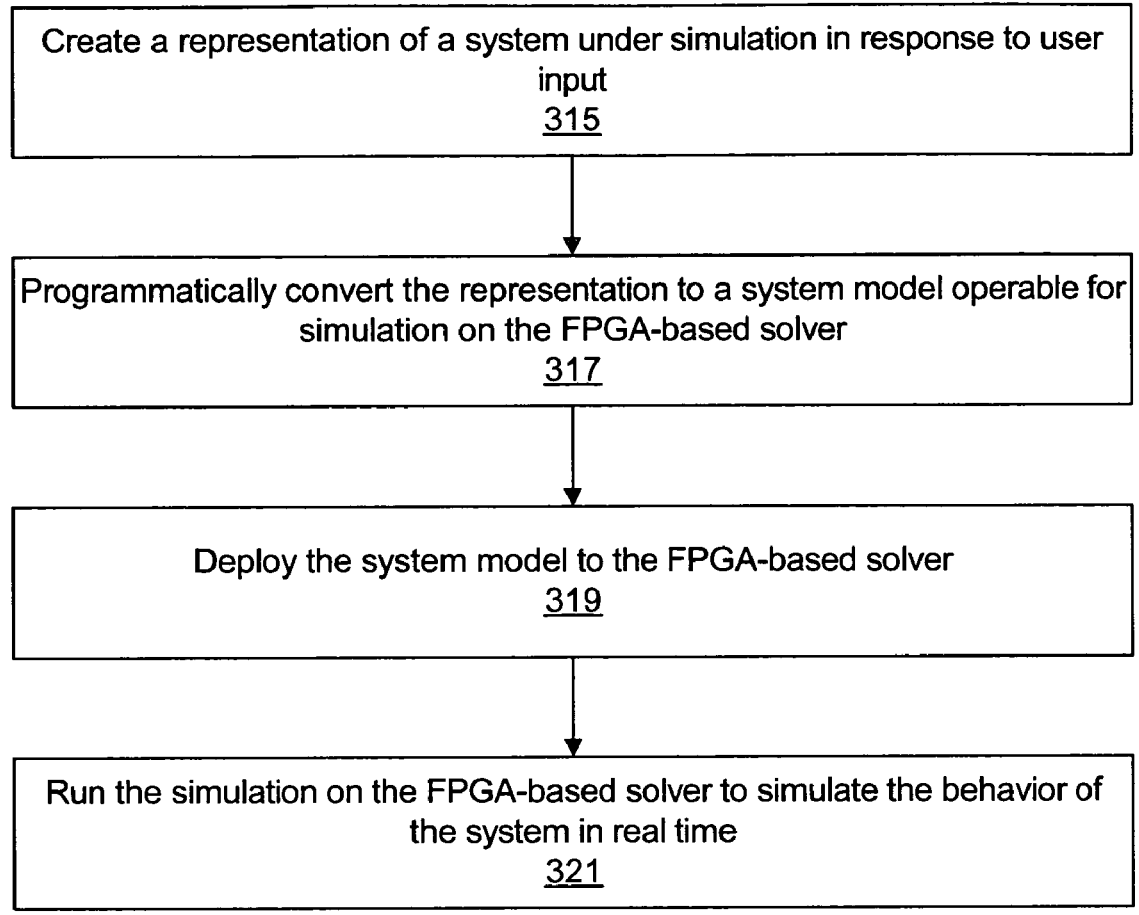
FIG. 7 is a flowchart diagram illustrating one embodiment of a method for performing a simulation of a system under simulation, using the system of FIG. 1B.

FIG. 7 is a flowchart diagram illustrating one embodiment of a method for performing a simulation of a system under simulation, using the system of FIG. 1B. It is noted that FIG. 7 illustrates a representative embodiment, and alternative embodiments are contemplated. Also, various elements may be combined, omitted, or performed in different orders.

In 315, a representation of the system under simulation may be created in response to user input, e.g., user input to software executing on the computer system 82. In various embodiments, 315 may comprise creating any of various kinds of information representing the system to be simulated. For example, the user may specify textual and/or graphical information representing the system to be simulated. As described below, in one embodiment, 315 may comprise creating a diagram of the system to be simulated in response to user input.

In 317, the representation created by user input in 315 may be programmatically or automatically converted to a system model 208 operable for simulation on the FPGA-based solver, e.g., by software executing on the computer system 82. Converting the representation created by user input to the system model 208 may comprise automatically converting the representation created by user input to another format suitable for configuring the FPGA device 200, such as a plurality of model coefficients, e.g., model matrix coefficients. In other words, the system model 208 for configuring the FPGA device 200 may be automatically generated based on the representation created by user input in 315. For example, the representation may be stored in memory, e.g., memory of the computer system 82, and software executing on the computer system 82 may analyze the representation to automatically convert it to the system model 208.

In one embodiment the representation created in response to user input may first be converted to one or more intermediate formats before arriving at the final system model 208 to be used in configuring the FPGA device 200. For example, as described below, in one embodiment the user may create a diagram of a circuit to be simulated in 315. The diagram may then be automatically converted to a netlist representing the circuit. The netlist may then be automatically converted to a matrix set of coefficients that specify a set of equations, where the matrix set of coefficients is then deployed on the FPGA device 200.

As described above, the system model 208 may specify a set of equations representing the system under simulation. In one embodiment the user may specify the equations directly in 315. In another embodiment a set of equations may be automatically derived from the representation created by user input. As one example, where the user creates a diagram representing an electronic circuit, a set of equations representing behavior of the electronic circuit may be automatically derived from the circuit diagram, e.g., where the equations are specified by a matrix set of coefficients, as described above.

In 319 the system model 208 generated in 317 may be automatically deployed to the FPGA-based solver. For example, software executing on the computer system 82 may communicate with the FPGA device 200 to cause the coefficients stored in memory to be loaded into memory (e.g., registers) on the FPGA device 200.

In an alternative (and currently less preferred) embodiment, the system model 208 may be configured as a hardware configuration program and implemented as gates or other elements on the FPGA device 200.

In 321 the simulation based on the system model 208 may be run on the FPGA device 200, where the simulation is driven by the generic time domain solver 206. As discussed above, running the simulation on the FPGA-based solver may allow the simulation to be performed very fast, optionally in real time. Running the simulation may involve the FPGA device 200 receiving input signals from the input hardware 202 and passing output signals to the output hardware 204, as described in more detail below. In one embodiment, the user may use a GUI or front panel to tune coefficients of the system model on the FPGA 200 as the simulation is being executed on the FPGA 200.

Figure 8:
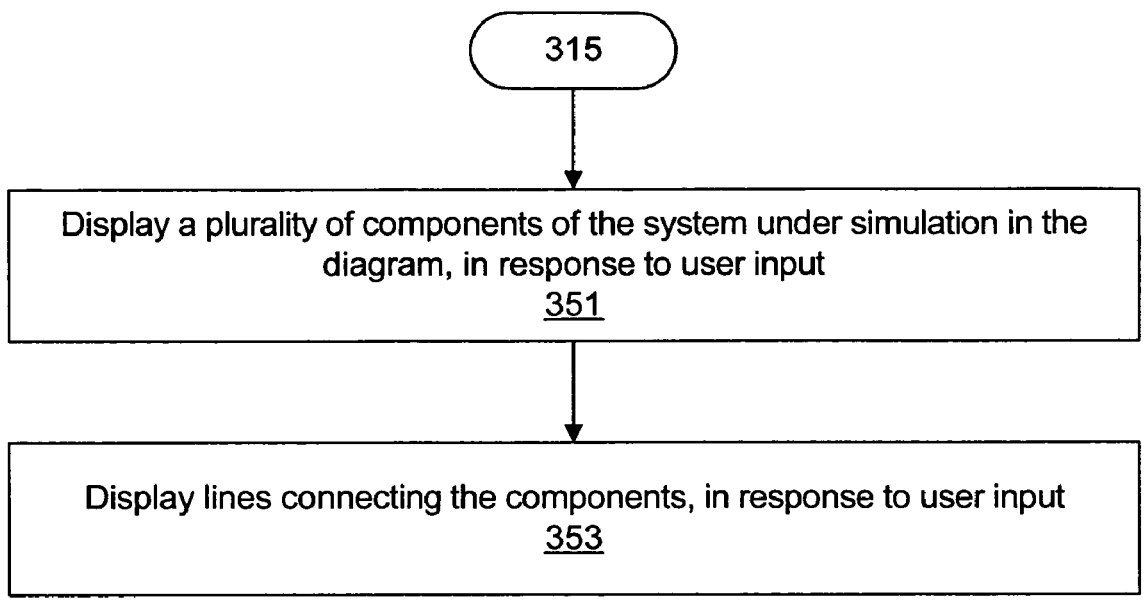
FIG. 8 is a flowchart diagram illustrating an exemplary method for creating a diagram representing a system under simulation.

As noted above with respect to 315 of FIG. 7, in one embodiment the user may create the representation of the system under simulation by creating a diagram. FIG. 8 is a flowchart diagram illustrating an exemplary method for creating a diagram representing the system under simulation, i.e., illustrating one embodiment of 315 of FIG. 7. It is noted that FIG. 8 illustrates a representative embodiment, and alternative embodiments are contemplated. Also, various elements may be combined, omitted, or performed in different orders.

In 351, a plurality of components of the system under simulation may be displayed in the diagram, in response to user input, e.g., user input to software executing on the computer system 82. For example, the software may include a graphical user interface that enables a user to select various components for inclusion in the diagram, e.g., by dragging the components from various palettes and dropping them into the diagram, or using other selection techniques.

Each of the components may be displayed as an icon within the diagram. For example, where the system under simulation comprises an electronic circuit, the components may be displayed in the diagram as icons representing various electronic components that form the circuit. The user may arrange, or position the icons spatially within the diagram as desired.

In 353, lines or wires connecting the components may be displayed, in response to user input. For example, a plurality of lines or wires may be displayed, where each line connects two of the components in the diagram. The lines may specify interrelationships among the components. For example, where the system under simulation comprises an electronic circuit, a line between two components may represent an electrical connection between the components.

In one embodiment, creating the diagram representing the system under simulation may comprise creating a block diagram for an executable graphical program. In this embodiment, the diagram may be created in response to user input to a block diagram editor of a graphical programming development environment. Each component icon displayed in the diagram may comprise an executable node in the graphical program. In one embodiment, the lines or wires connecting the nodes or icons may represent data flow among the nodes. For example, a line connecting a first node and a second node may indicate that data produced by the first node is consumed by the second node during execution of the graphical program. The plurality of interconnected graphical program nodes may visually indicate functionality of the system under simulation.

In one embodiment the user may also create a graphical user interface (GUI) for the graphical program. The graphical user interface may include one or more GUI elements operable to display output from the graphical program on a display device. In one embodiment the functionality of displaying the program output may be preserved when the system model 208 is deployed on the FPGA device 200 so that during the simulation, the FPGA device 200 is operable to pass output from the simulation for display on a display device.

In one embodiment the graphical program may be executable to automatically generate at least a portion of the system model 208. For example, in one embodiment, each node in the graphical program may represent a particular type of system component. During execution of the graphical program, each node may execute to automatically generate a portion of the system model 208, where the portion generated by the node corresponds to the system component represented by the node. In another embodiment, the nodes in the graphical program may not generate the system model 208 directly but may generate information that characterizes the diagram, where the system model 208 is then automatically generated from this information. For example, suppose that the block diagram of the graphical program illustrates an electronic circuit. Each node in the graphical program may represent a particular component in the circuit. The graphical program may be automatically analyzed to generate a set of parameters, e.g., a set of matrix coefficients specifying equations that represent behavior of the circuit. The set of matrix coefficients is used as the system model 208 for configuring the FPGA device 200. For example, a netlist may be automatically generated from the graphical program, and the matrix coefficients may be generated from the netlist.

It is noted that FIG. 8 illustrates a representative embodiment of a method for creating a diagram representing the system under simulation, and in other embodiments other types of diagrams may be created. Also, the system under simulation may have other representations instead of, or in addition to, a diagram. For example, in one embodiment the user may create text information representing the system under simulation. In one embodiment, the user may create a text-based program representing the system under simulation. As another example, in one embodiment the user may create mathematical equations representing the system under simulation.

Figure 9:
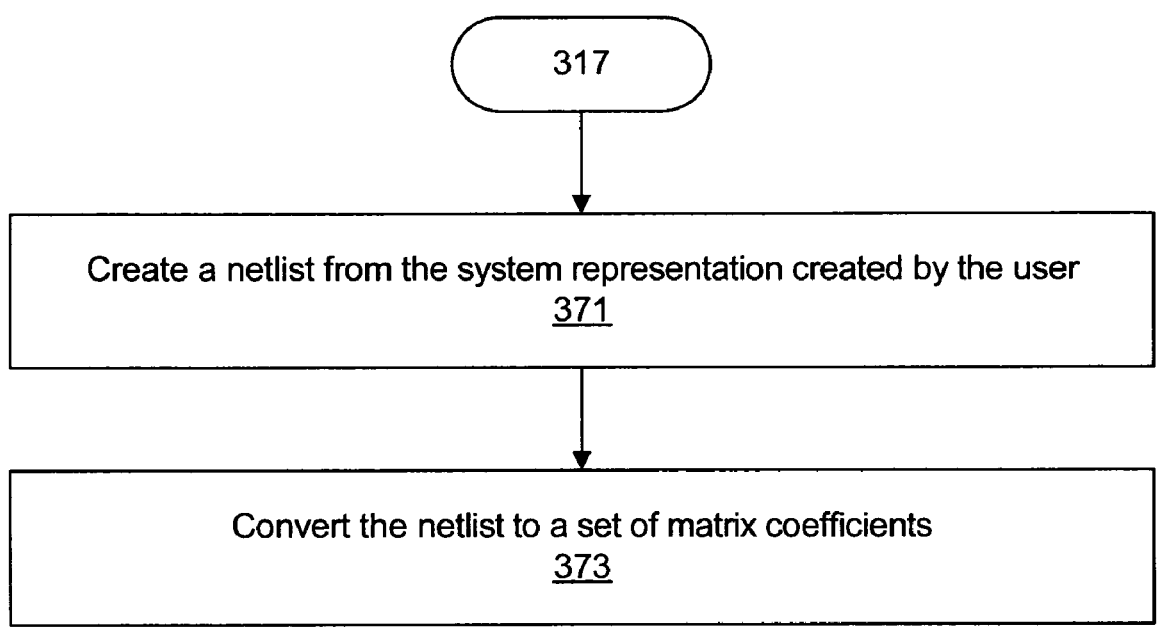
FIG. 9 is a flowchart diagram illustrating an exemplary method for automatically converting a representation of a system under simulation to a system model operable for simulation on the FPGA-based solver.

As noted above with respect to 317 of FIG. 7, the representation of the system under simulation created by user input may be programmatically or automatically converted to a system model 208 operable for simulation on the FPGA-based solver. In other words, the system model 208 may be automatically generated based on the representation of the system under simulation. FIG. 9 is a flowchart diagram illustrating an exemplary method for performing 317. It is noted that FIG. 9 illustrates a representative embodiment, and alternative embodiments are contemplated. Also, various elements may be combined, omitted, or performed in different orders.

In 371, a netlist may be automatically created based on the diagram or other system representation created by the user in 315.

In 373, the netlist may be automatically converted to a set of matrix coefficients.

Figure 10:
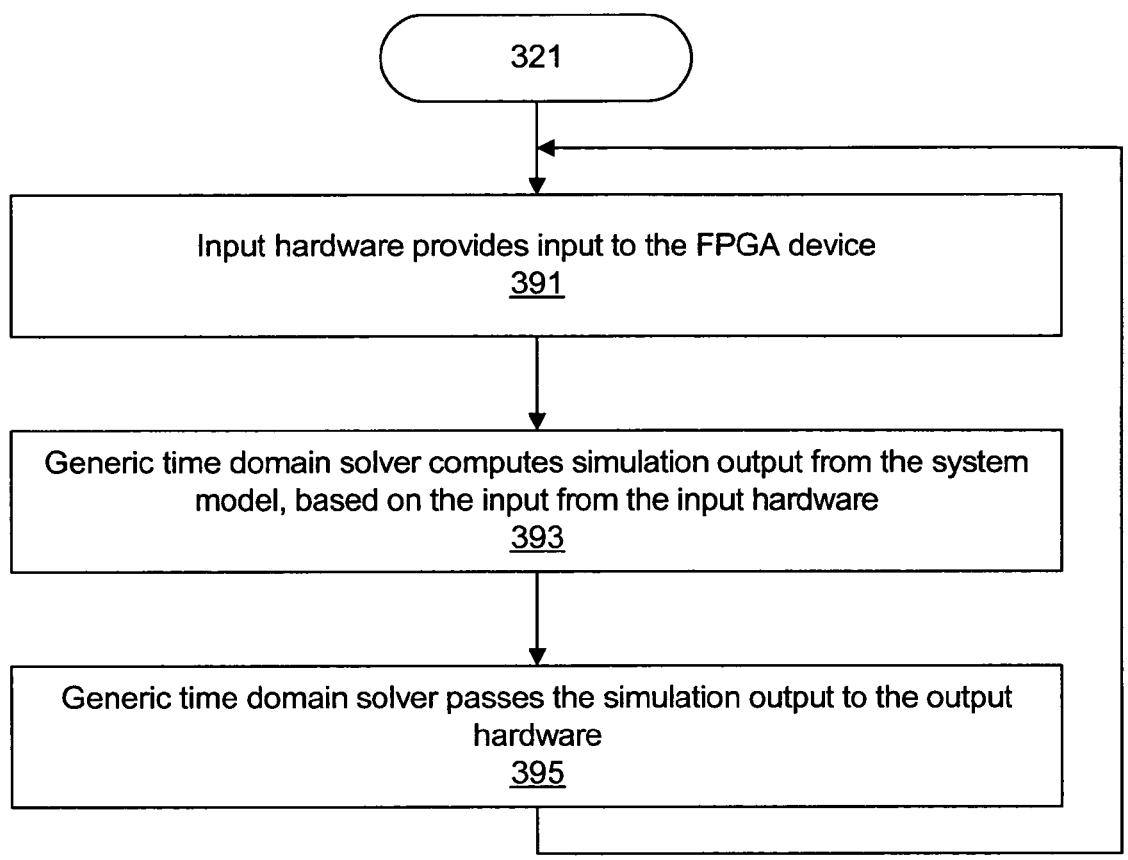
FIG. 10 is a flowchart diagram illustrating an exemplary method for running a simulation on a system model that has been deployed to the FPGA device of FIG. 1B.

As noted above with respect to 321 of FIG. 7, once the system model 208 has been deployed to the FPGA device 200, the simulation based on the system model 208 may be run on the FPGA device 200. FIG. 10 is a flowchart diagram illustrating an exemplary method for performing 321. It is noted that FIG. 10 illustrates a representative embodiment, and alternative embodiments are contemplated. Also, various elements may be combined, omitted, or performed in different orders.

In 391, the input hardware 202 provides one or more input signals to the FPGA device 200. For example, the input signals may be provided to the FPGA device 200 as digital signals.

In 393, the generic time domain solver 206 computes simulation output from the system model 208, based on the input signals received from the input hardware 202. For example, the generic time domain solver 206 may be operable to perform a plurality of time steps. For each time step, the solver may generate a portion of the output signal, where the output signal is generated based on the result of solving the equations that represent the system under simulation, and where the equations are solved based on the portion of the input signal received at that time step. In one embodiment the generic time domain solver 206 may perform the plurality of time steps deterministically at a precisely timed rate.

In 395, the generic time domain solver 206 passes the simulation output to the output hardware 204. The output hardware 204 produces output in response to the output signal, which may allow a user to evaluate performance of the system under simulation.

Various embodiments of the system of FIGS. 1A or 1B may enable users to easily test modifications to a system under simulation by simply changing the system diagram (or other representation) of the system under simulation and deploying a new system model based on the changed diagram to the FPGA or other programmable hardware element.

Figure 11:
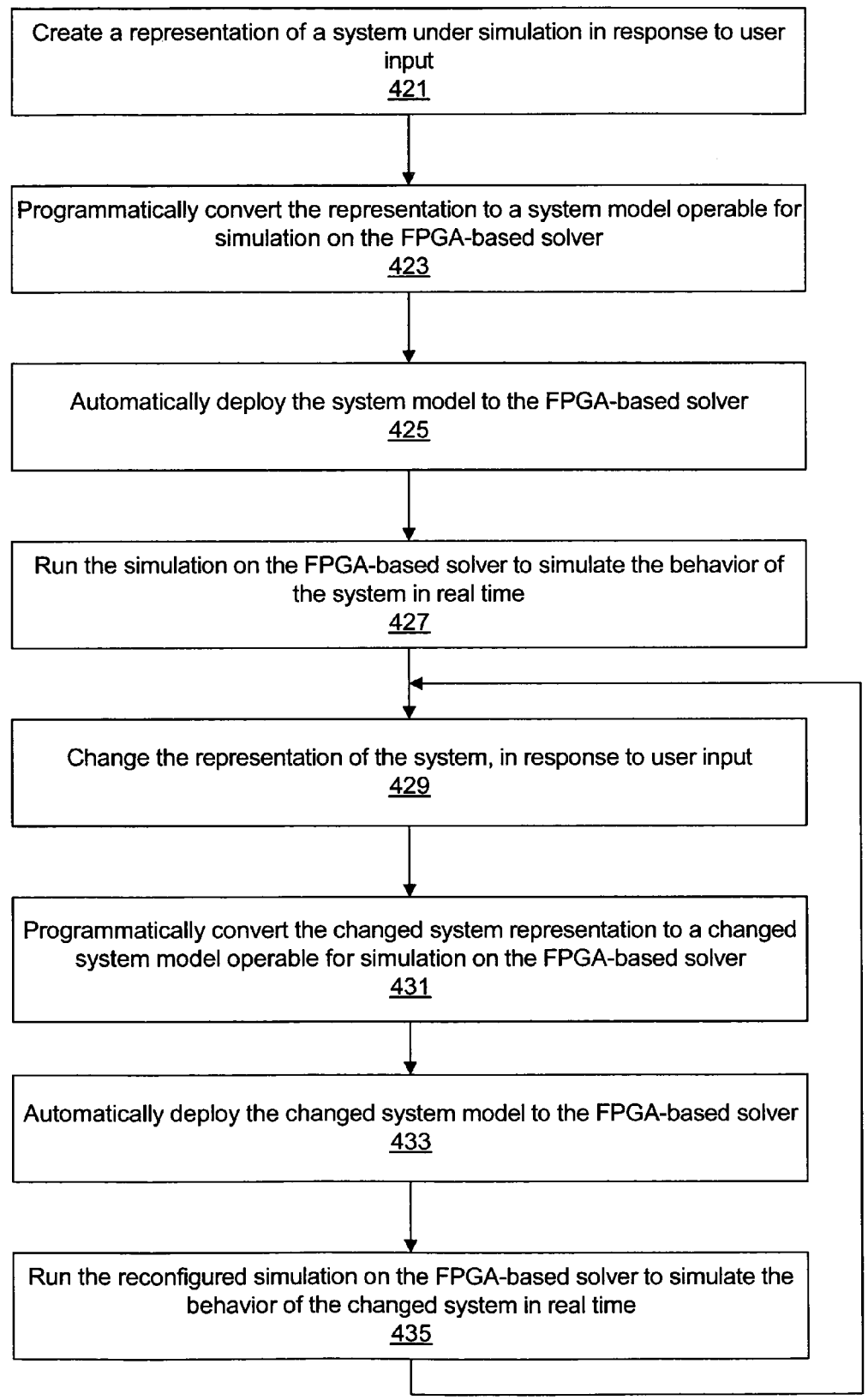
FIG. 11 is a flowchart diagram illustrating one embodiment of a method for testing changes to the system under simulation.

FIG. 11 is a flowchart diagram illustrating one embodiment of a method for testing changes to the system under simulation. It is noted that FIG. 11 illustrates a representative embodiment, and alternative embodiments are contemplated. Also, various elements may be combined, omitted, or performed in different orders.

In 421, a diagram or other representation of the system under simulation is created in response to user input, similarly as described above with reference to 315 of FIG. 7.

In 423, the representation of the system is programmatically converted to a system model 208 operable for simulation on the FPGA-based solver, similarly as described above with reference to 317 of FIG. 7.

In 425, the system model 208 is automatically deployed to the FPGA-based solver, similarly as described above with reference to 319 of FIG. 7.

In 427, the simulation is run on the FPGA-based solver to simulate the behavior of the system in real time, similarly as described above with reference to 321 of FIG. 7.

In 429, the system representation created in 421 is changed, or an entirely new system representation is created, in response to user input. For example, based on results observed during the original simulation, the user may decide to modify the system to achieve an improvement or correction or simply to test the effects of the modification. Thus, the user may change the diagram or other system representation that was originally created to reflect the desired modification. In one embodiment, the user may change the model using a GUI or front panel.

In 429, simulation tools can be used to very quickly change the model by changing the matrix coefficients of the model. It is noted that changing the model may comprise:

1) The model has the same circuit topology but at least one component value changes. For example, a specific resistance value can be changed in the model (FIG. 23 shows this case where the model value that can be changed is controlled by the sliders Rq and/or Freq); and/or 2: An entirely new circuit topology can be developed. For example components are added or completely removed from the model; this may or may not result in a different number of nodes in the model (FIG. 23 shows this case where the new topology is controlled by the pull-down menu showing the four options in this example).

In 431, the changed system representation may be programmatically converted to a changed system model 208 operable for simulation on the FPGA-based solver. In some embodiments, 431 is not required.

In 433, the changed system model 208 may be deployed to the FPGA-based solver, either automatically or in response to user input. Deploying the changed system model 208 to the FPGA solver may comprise replacing the previously deployed system model 208 in the memory of the FPGA 200 with the changed system model 208. In other words, the changed system model,208, which may comprise a plurality of coefficients, may be transferred from computer memory to the FPGA device 200. Thus the generic time domain solver performs the simulation based on the changed system model 208 instead of the previously deployed system model 208. As described above, the generic time domain solver 206 is modularized from the system model 208 used in the simulation and may be able to perform simulations for any system model 208. Thus, the changed system model 208 may be deployed on the FPGA device 200 without requiring changes to the generic time domain solver 206 deployed on the FPGA device 200. Also, since changing the system model on the FPGA 200 merely comprises updating registers on the FPGA 200 with new coefficients, the change can be performed very quickly.

In 435, the reconfigured simulation may be run on the FPGA-based solver to simulate the behavior of the changed system in real time. The generic time domain solver 206 may operate to produce a changed output signal based on the changed system model 208, which causes the output hardware 204 to produce changed output. Thus, the user may be able to observe the effects of the change made to. the system representation in 429, e.g., by observing the difference in the behavior of the output hardware 204. As indicated by the flowchart arrow returning from 435 to 429, the user may repeat the process of changing the system design as many times as desired.

In one embodiment, the changed system model 208 may be deployed to the FPGA device 200 "on-the-fly", e.g., while the solver is executing on a prior model. It is noted that the change or update to the model and redeployment of the model onto the FPGA may be performed in a substantially continuous fashion relative to the solver executing the first model, i.e., the process of updating and executing the model appears continuous (smooth and natural) to the user. In other words, since the model update and deployment takes only microseconds, the solver operation may appear continuous and uninterrupted to the user during the update, re-deployment and execution of the updated model. Thus this operation may appear to occur in "real time" to the user.

For simple changes to the system under simulation, it may take the user only a few minutes or even seconds to modify the diagram or other representation of the system. In some embodiments, the process of automatically converting the diagram or other representation of the system to a system model 208 operable for simulation on the FPGA-based solver may be performed very quickly, possibly in a matter of seconds or even a fraction of a second. Likewise, in some embodiments the system model 208 may be relatively simple (e.g., a set of matrix coefficients) so that the FPGA device 200 can be reconfigured with the changed system model 208 very quickly, e.g., in a matter of seconds or even a fraction of a second. Thus, the user can very quickly observe the effects of modifying the system under simulation.

Moreover, since the simulation is performed by the FPGA device 200 operating in conjunction with real input hardware 202 and real output hardware 204, a very fast (e.g., real-time) simulation of each.version of the system under simulation may be performed. Thus, a system such as shown in FIG. 1A or 1B may allow users to easily and quickly perform real-time simulations of a set of system designs and observe the effects of various modifications in the-designs.

Figure 12A:
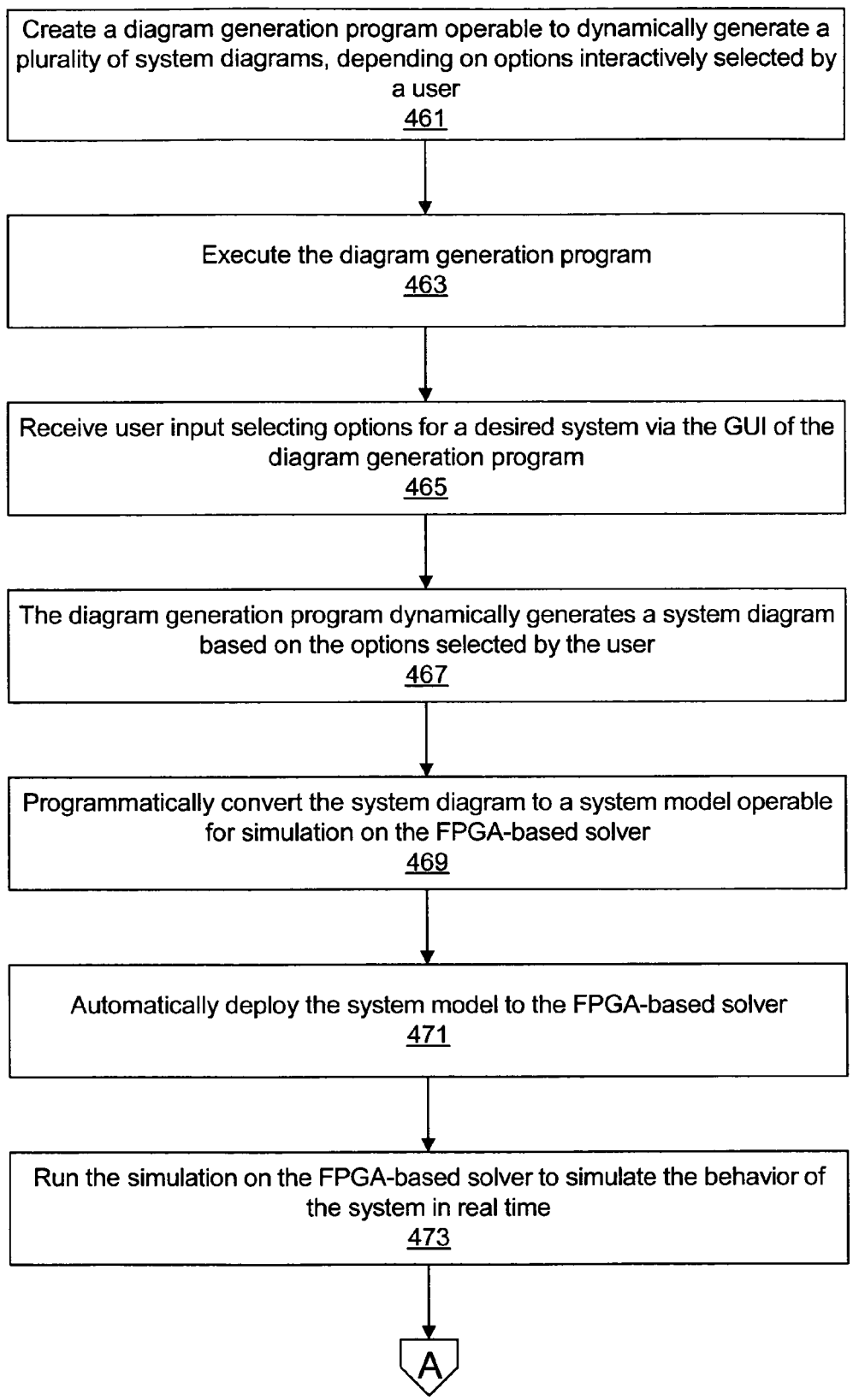
FIGS. 12A and 12B illustrate a flowchart diagram showing another embodiment of a method for testing changes to the system under simulation.
Figure 12B:
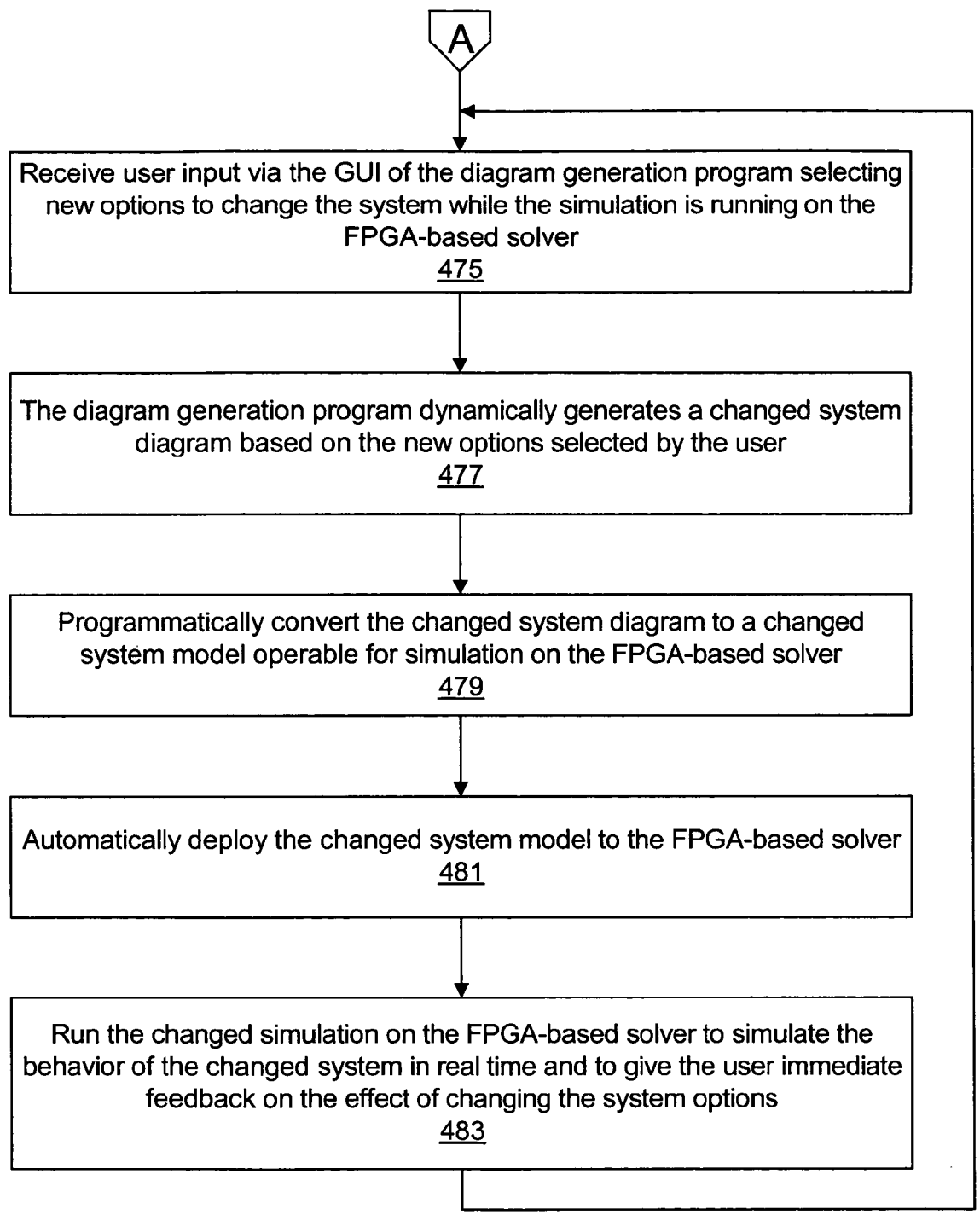

FIGS. 12A and 12B illustrate a flowchart diagram showing another embodiment of a method for testing changes to the system under simulation. In this embodiment it is even easier and quicker for the end user to observe the effects of changing the system under simulation.

In 461, a diagram generation program may be created, where the diagram generation program is operable to dynamically generate a plurality of system diagrams (or other system representations), depending on options interactively selected by a user. For example, when the diagram generation program is executed, the diagram generation program may display a graphical user interface including one or more GUI input controls allowing the user to select various options to configure the system under simulation. The diagram generation program may then programmatically or automatically generate a diagram of a system to be simulated, based on the system options selected by the user. Thus, the diagram of the system to be simulated may be automatically generated without user input directly specifying the diagram.

In 463, the diagram generation program may be executed, e.g., on the computer system 82. As described above, the diagram generation program may display a graphical user interface allowing the user to select various configuration options affecting the system under simulation.

In 465, the diagram generation program may receive user input to the graphical user interface selecting configuration options for a desired system to be simulated on the FPGA-based solver.

In 467, the diagram generation program may programmatically (automatically) generate a diagram representing the system to be simulated. The diagram may be generated at least in part based on the options selected by the user. For example, the diagram generation program may call functions of an application programming interface (API) for dynamically creating components in the diagram. In another embodiment, components in the diagram may not be dynamically generated, but different components may be automatically selected for inclusion in the diagram based on the configuration options selected by the user, e.g., through the use of a Case structure or similar mechanisms.

In 469, the system diagram generated by the diagram generation program may be automatically converted to a system model 208 operable for simulation on the FPGA-based solver, similarly as described above.

In 471, the system model 208 may be automatically deployed to the FPGA-based solver, similarly as described above.

In 473, the simulation may be run on the FPGA-based solver to simulate the behavior of the system represented by the generated diagram in real time, similarly as described above.

In 475, user input selecting new options to change or reconfigure the system under simulation may be received via the GUI of the diagram generation program. In one embodiment the user may select the new options while the simulation of the original system is running on the FPGA-based solver.

In 477, the diagram generation program may automatically or programmatically generate a changed system diagram (or may automatically change the original system diagram) based on the new options selected by the user.

In 479, the changed system diagram may be automatically converted to a changed system model 208 operable for simulation on the FPGA-based solver, similarly as described above.

In 481, the changed system model 208 may be automatically deployed to the FPGA-based solver, similarly as described above. As noted above, deployment of the changed system model may comprise loading one or more new matrix coefficients from RAM into memory on the FPGA.

In 483, the changed simulation may be run on the FPGA-based solver to simulate the behavior of the changed system in real time and to enable the user to evaluate the effect of changing the system.

The user may thus use the diagram generation program to generate successive versions of the system under simulation and observe a real-time simulation of each version, without having to do anything more than selecting different system options using the graphical user interface of the diagram generation program. This capability may be useful, for example, in an instructional setting. For example, an instructor in an electrical engineering course may create a diagram generation program operable to generate different circuit diagrams, depending on options selected by the user. As a simple example, the diagram generation program may be operable to alter a diagram of an audio filtering circuit by replacing components of the circuit with different circuit logic, depending on which type of filtering is selected by the user using the graphical user interface of the diagram generation program. The FPGA-based solver may be connected to audio input hardware and audio output hardware so that the user is able to hear the effects of each type of audio filtering in real time.

In one embodiment the method of FIGS. 12A and 12B may enable the user to observe the changed behavior of the system substantially immediately after the user has changed the configuration options via the GUI of the diagram generation program. For example, the diagram generation program may first automatically generate a changed diagram in response to the user input to the GUI. A changed system model may also be automatically generated from the changed diagram in response to the user input. The FPGA device 200 may also be automatically reconfigured with the changed system model in response to the user input. In one embodiment, each of these operations may occur very quickly so that the user experiences the change in output from the FPGA-based solver as occurring immediately, or substantially immediately, in response to the user's input to the GUI to change the configuration options. For example, in the above example of the audio filtering circuit simulation, the user may hear an immediate difference in sound produced by the simulation. In another embodiment, the operations may require more time but still may enable the user to observe the effects of the changes very quickly, e.g., on the order of a few seconds.

Figure 13:
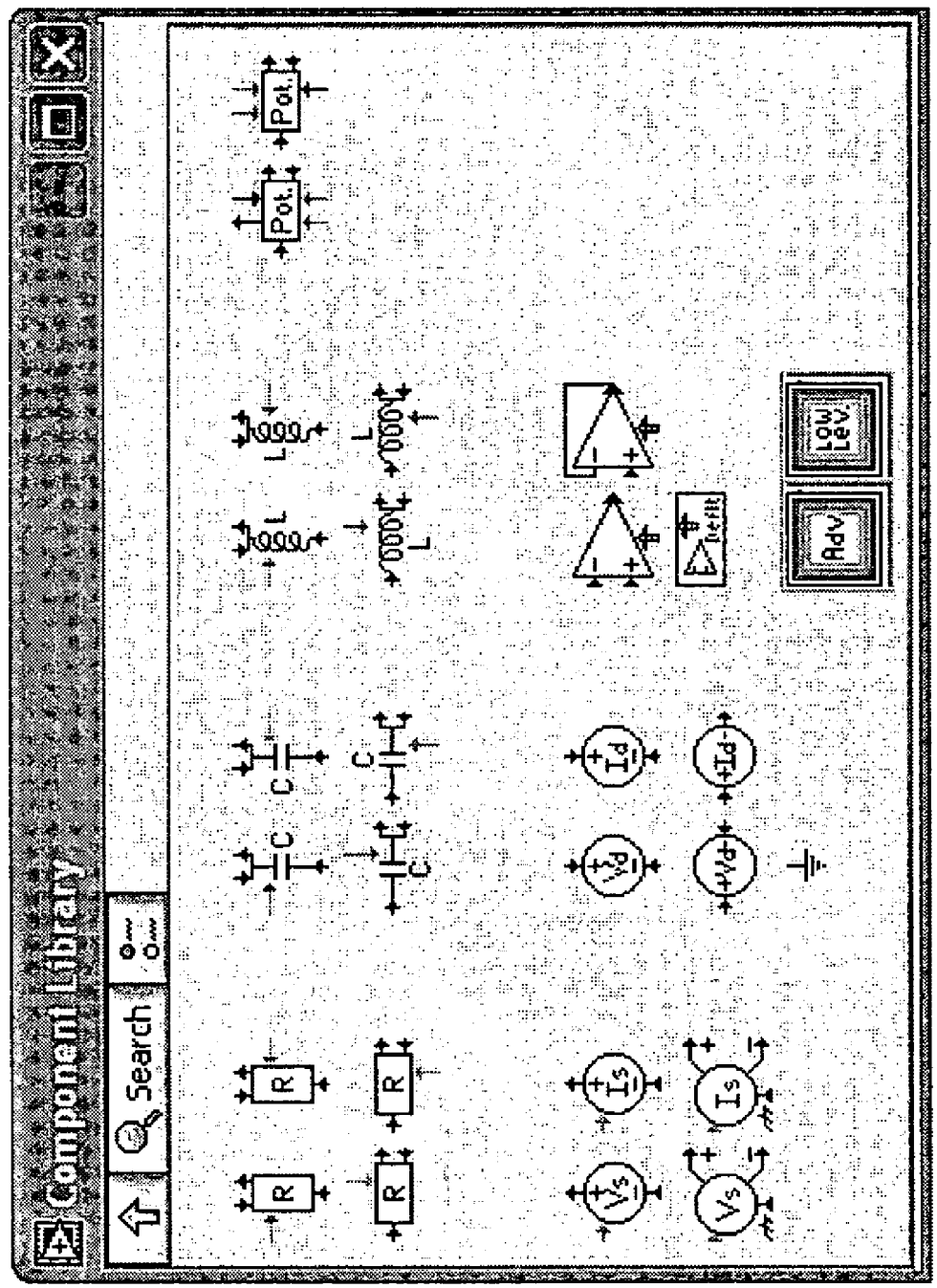
FIG. 13 illustrates a palette of electrical circuit components that can be used to create a LabVIEW graphical program representing a circuit design.
Figure 14:
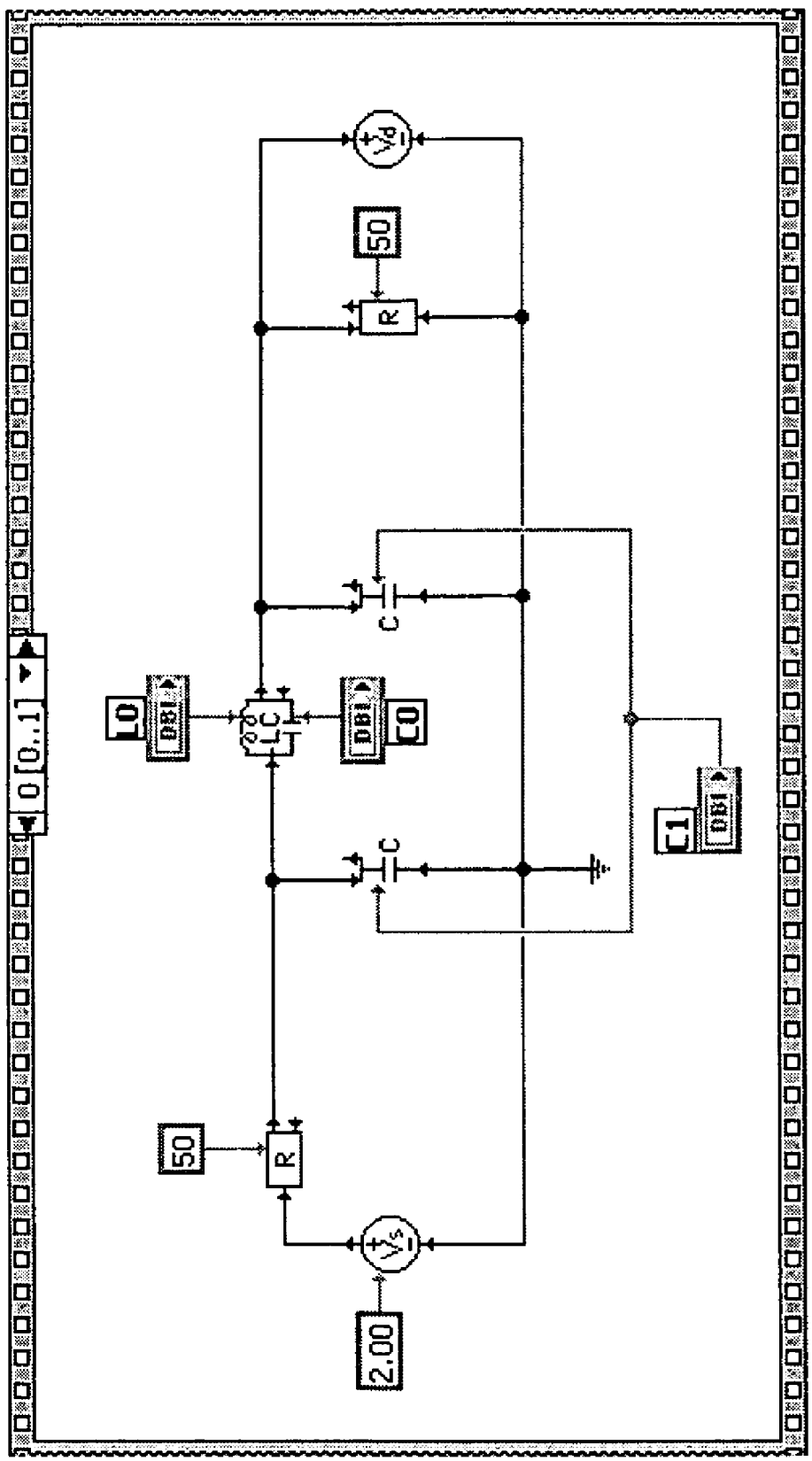
FIG. 14 illustrates an exemplary diagram of a circuit design to be simulated, where the circuit was created using the components illustrated in the palette of FIG. 13.

As discussed above, in one embodiment a user may create an executable graphical program representing the system to be simulated, wherein the graphical program comprises a block diagram that includes a plurality of interconnected nodes that visually indicate functionality of the system. For example, FIG. 13 illustrates a palette of nodes representing electrical circuit components. Nodes in this palette can be used to create a LabVIEW graphical program representing a circuit design. FIG. 14 illustrates an exemplary diagram of a circuit design to be simulated, where the circuit was created using the components illustrated in the palette of FIG. 13. The circuit diagram comprises a graphical program created using the LabVIEW graphical programming development environment. Each. LabVIEW wire represents a circuit node, and the wire value is an integer value that, in a unique way, represents the node number.

Figure 15:
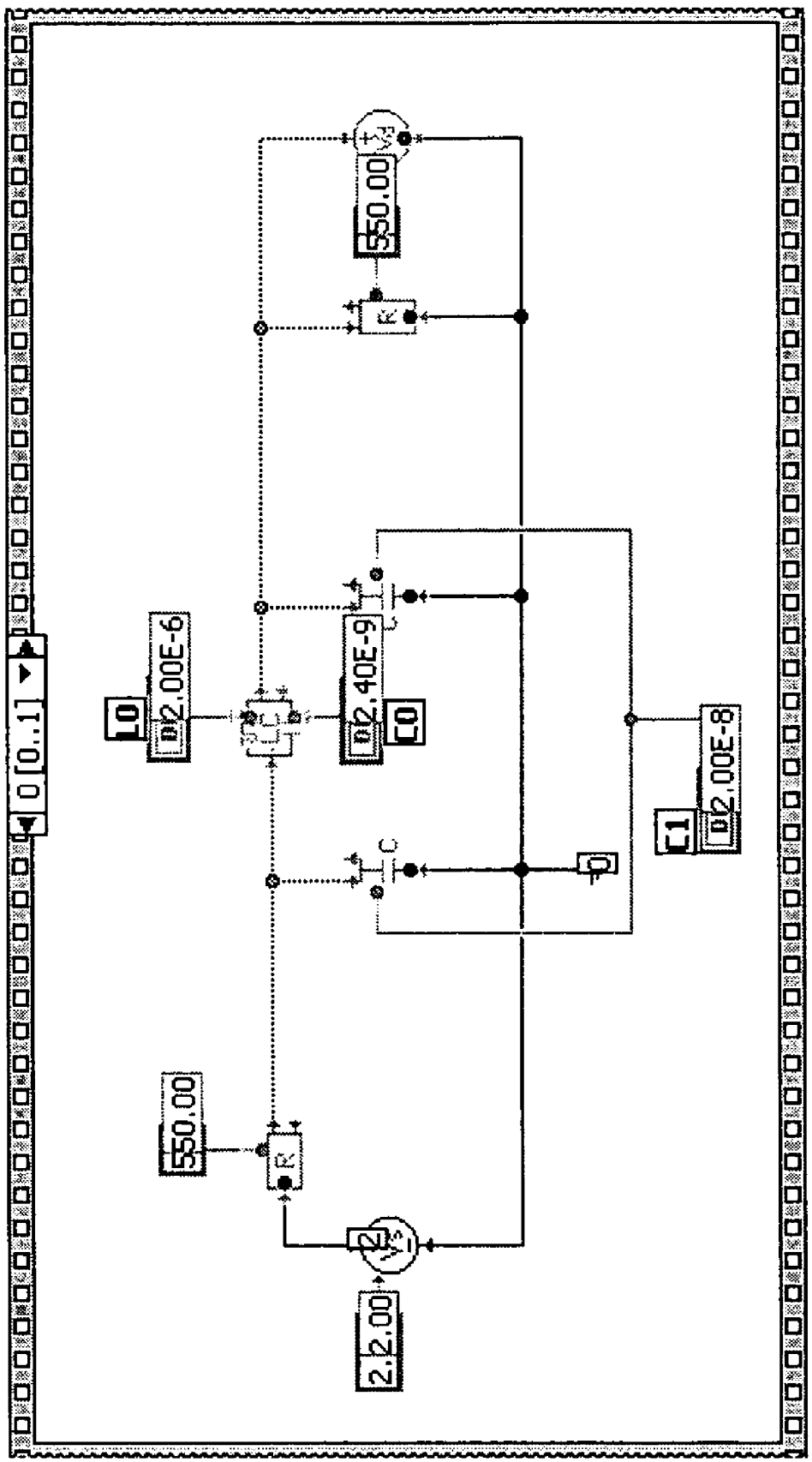
FIG. 15 illustrates allocation of node numbers during creation of a netlist representing a circuit diagram.
Figure 16:
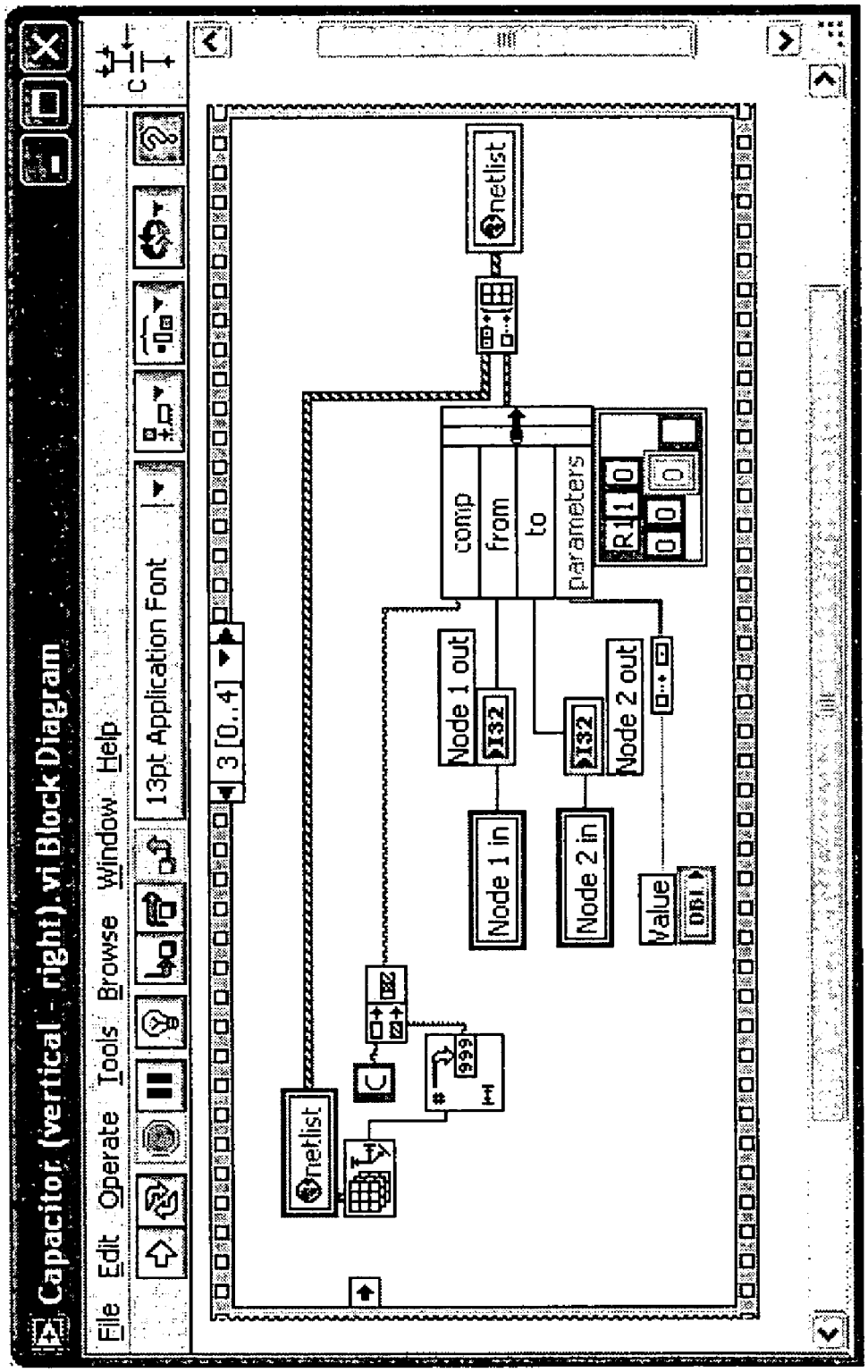
FIG. 16 illustrates the block diagram of a sub-VI representing a capacitor component in a circuit diagram.
Figure 17:
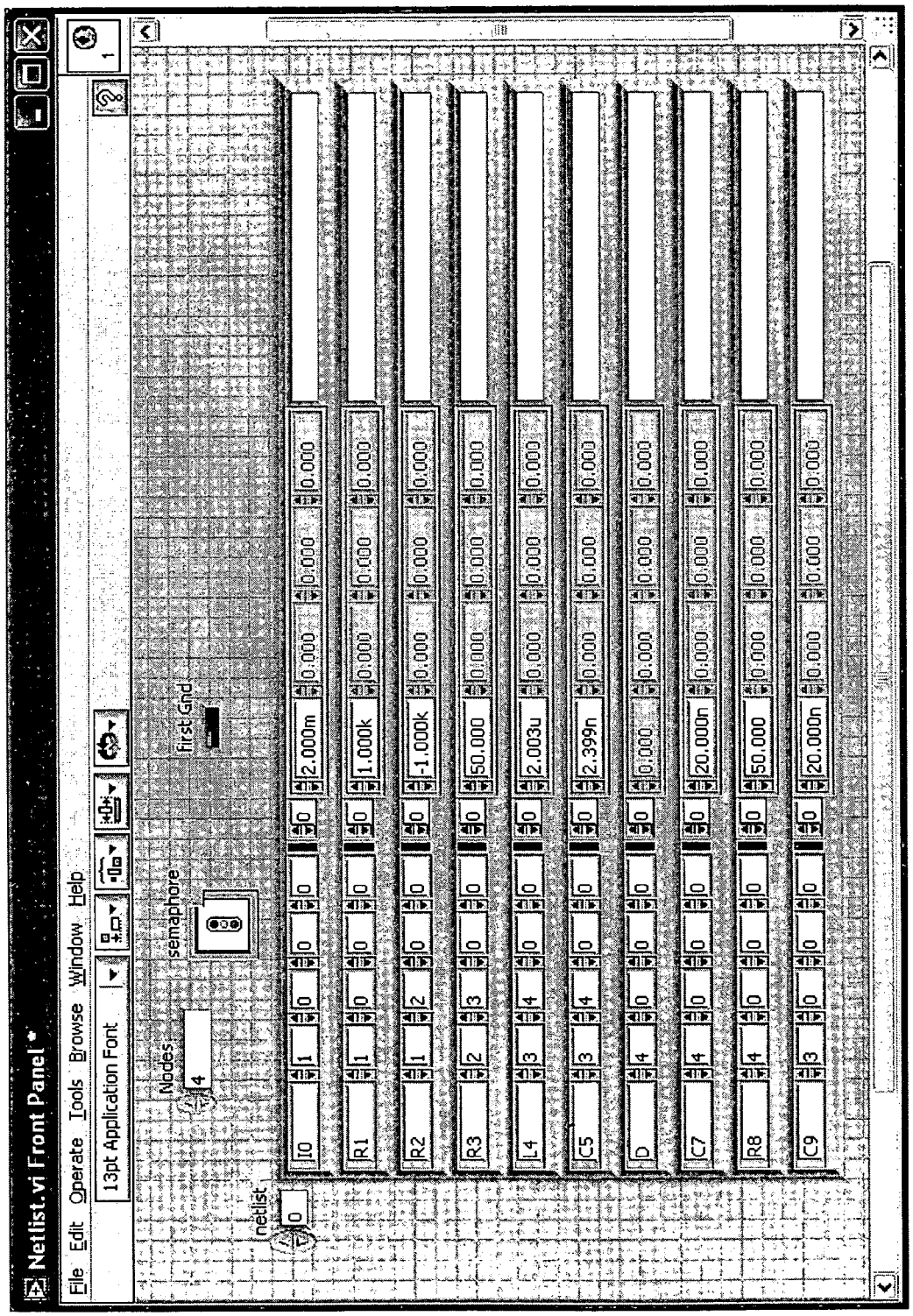
FIG. 17 illustrates a graphical representation of the final netlist representing a circuit.

The graphical program representing the circuit may be executed, which results in generation of a netlist representing the circuit. Execution of the graphical program starts from the circuit ground terminal (that has a pre-allocated node value of 0) because it is the only component (sub-VI node) that only has an indicator. Execution of the graphical program then runs through all the sub-VI nodes, allocating a new node number each time a new wire is interpreted. (See FIG. 15.) Each sub-VI node updates the netlist with the corresponding component type, values and node connections. For example, FIG. 16 illustrates the block diagram of a sub-VI node representing a capacitor component in the circuit diagram. This sub-VI is operable to update the netlist to indicate the component type (i.e., capacitor) and the values and node connections. The final netlist is stored in a local variable. FIG. 17 illustrates a graphical representation of the final netlist representing the circuit.

The netlist representing the circuit can then be interpreted, and the appropriate matrix set of coefficients used to compute frequency response (Bode Plot) or time domain response (Time Domain Solver) can be derived.

Figure 18:
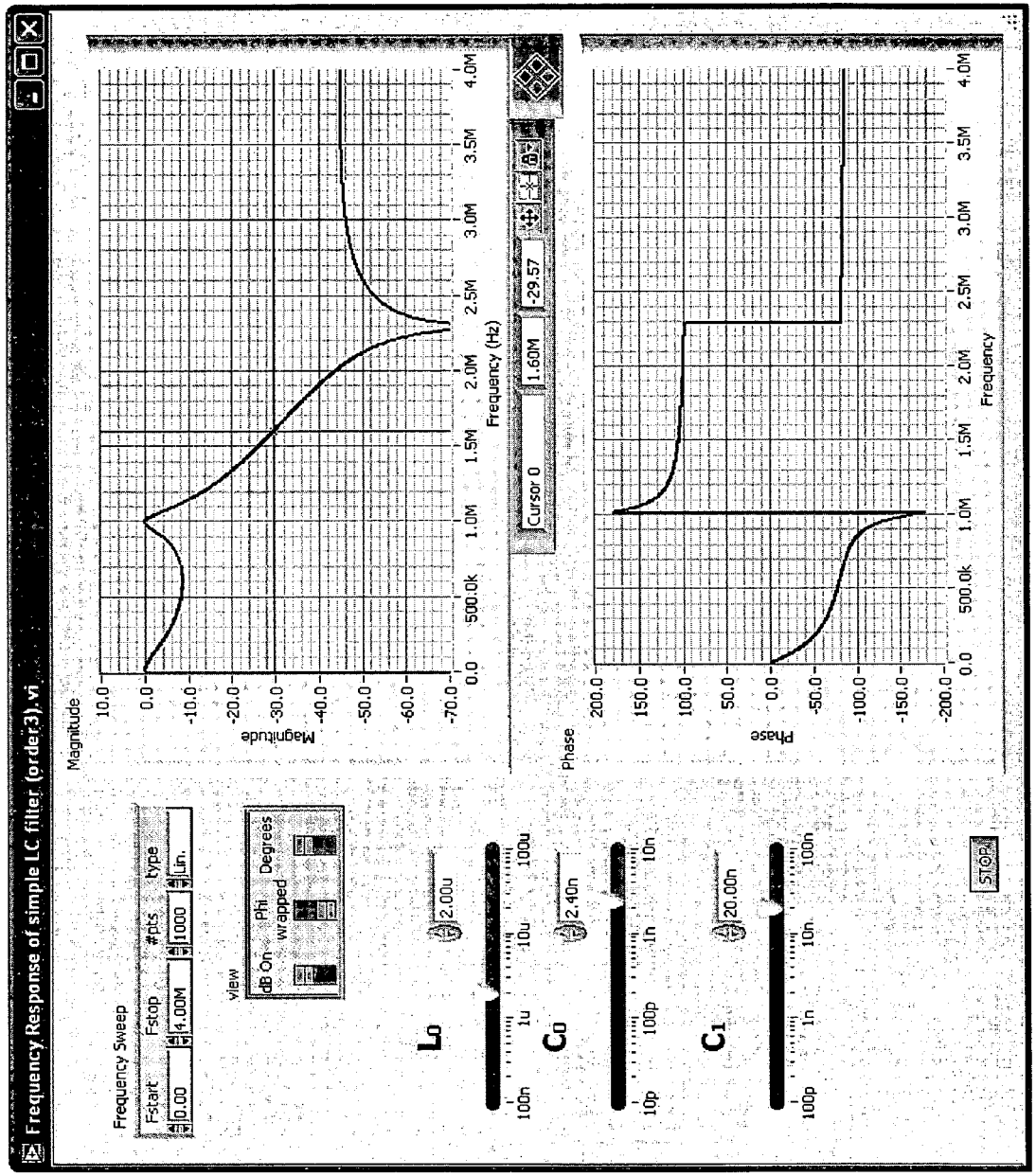
FIG. 18 illustrates a graphical user interface for the graphical program shown in FIG. 19, which represents a circuit diagram.
Figure 19:
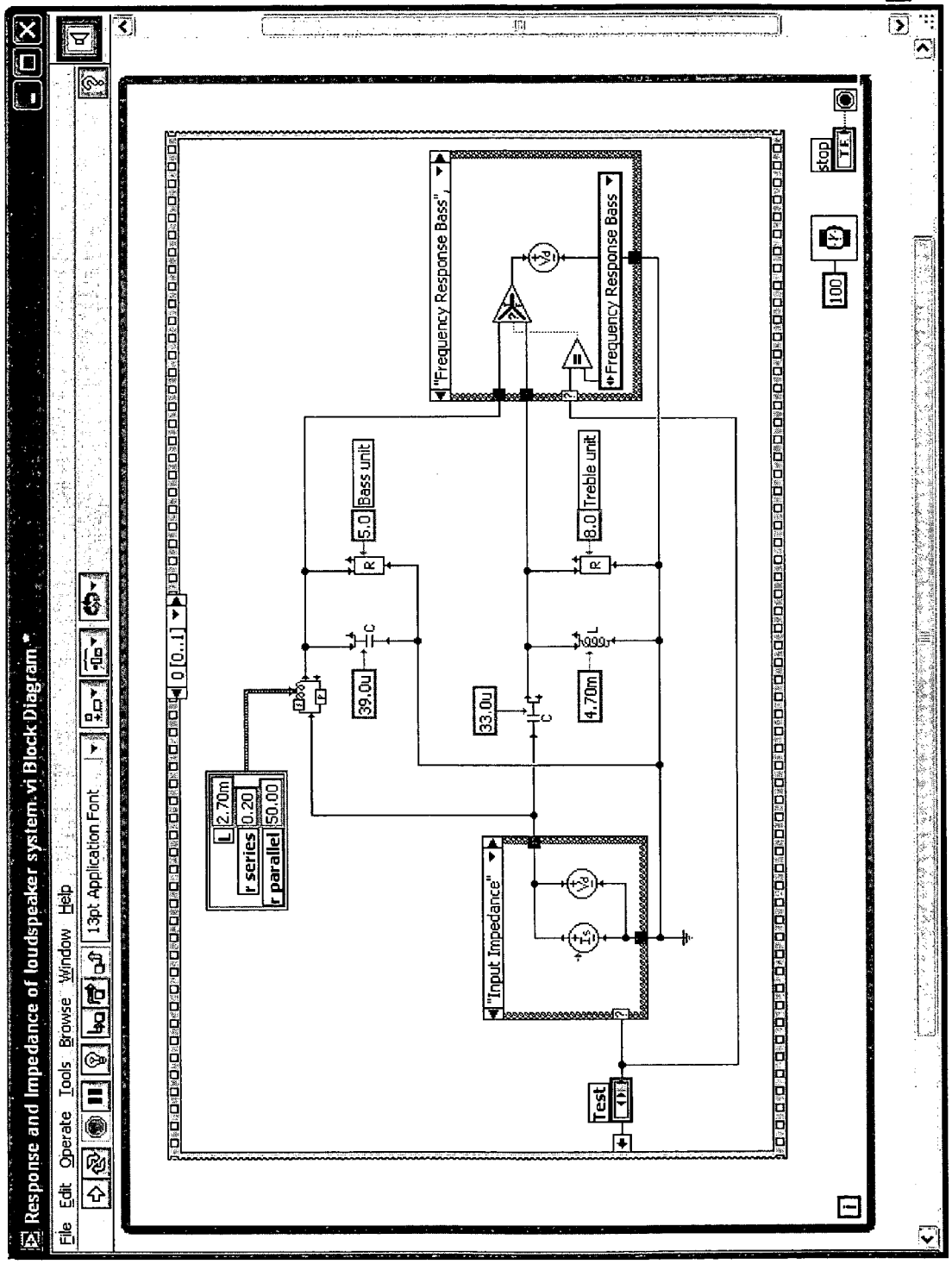
FIG. 19 illustrates a graphical program that represents a circuit diagram.

FIG. 18 illustrates a graphical user interface for the graphical program shown in FIG. 19, which represents another circuit diagram. In this example, the graphical program acts as a diagram generation program such as described above with reference to FIGS. 12A and 12B because different components are selected for inclusion in the circuit based on options selected by the user via the graphical user interface of FIG. 18. In particular, the graphical program of FIG. 19 is operable to generate different circuits to perform filtering of an audio signal in various ways, depending on which options are selected by the user. The graphical program shown in FIG. 19 includes various Case structures that select different graphical code portions representing the audio filtering logic, based on the options selected by the user.

Figure 20:
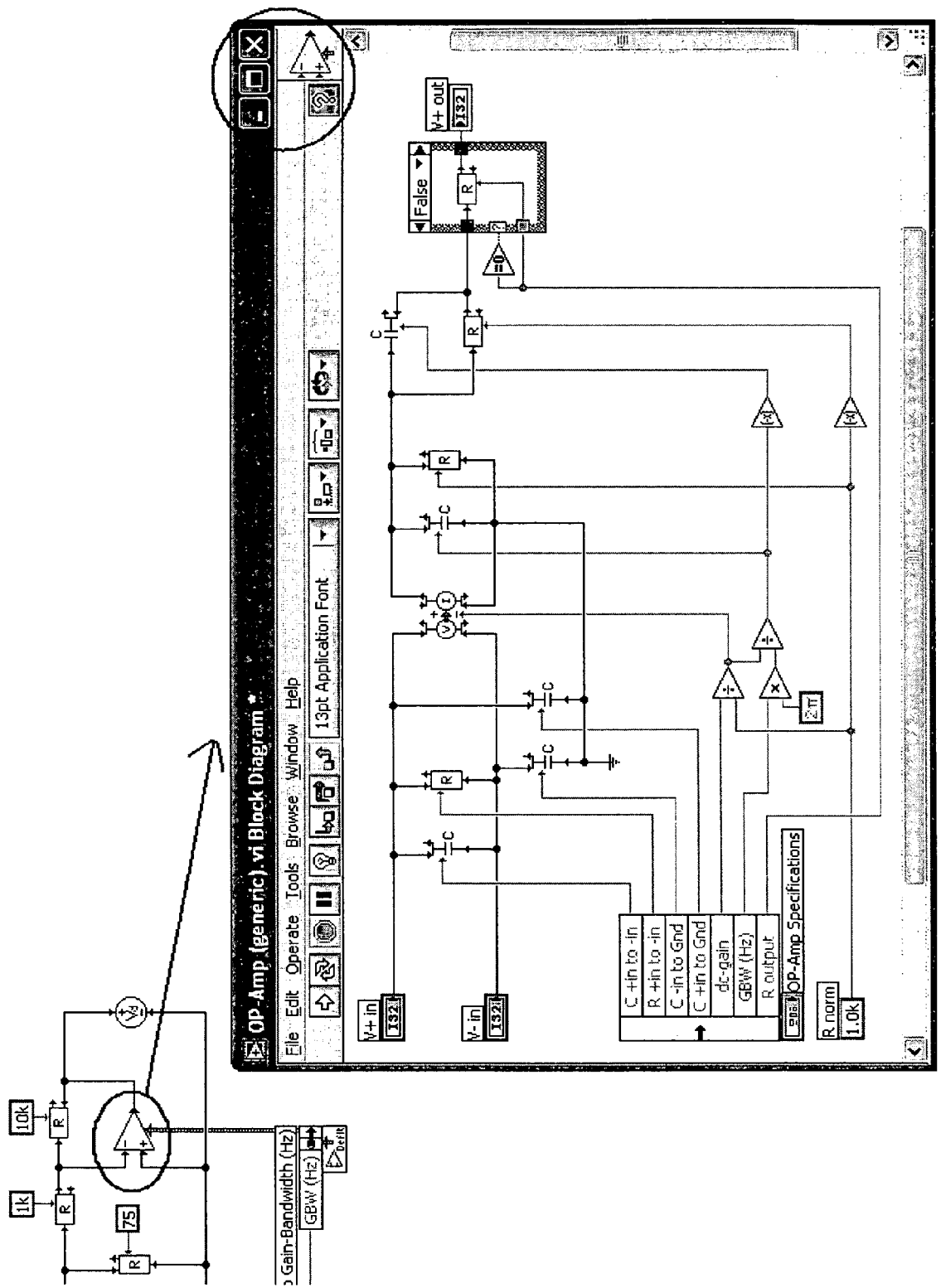
FIG. 20 illustrates a node representing a circuit sub-system, where the node can be included in a block diagram of a graphical program, and where the node has its own block diagram that represents the circuit diagram for the circuit sub-system.

The use of graphical program nodes or sub-VI's to represent compents of the system under simulation may advantageously enable hierarchical sub-systems to be designed. For example, a node representing a circuit sub-system can be included in a block diagram of a graphical program, where the node has its own block diagram that represents the circuit diagram for the circuit sub-system. The hierarchical concept allows the user to design sub-systems that are easy to read and/or modify. For example, FIG. 20 illustrates a first block diagram representing a first circuit diagram (top left corner) that includes a node (circled in the first block diagram) represnting an audio amplifier sub-system. FIG. 20 also illustrates a second block diagram encapsulated by this node. The second block diagram represents a circuit diagram (displayed in the illustrated window) of the audio amplifier sub-system.

Figure 21:
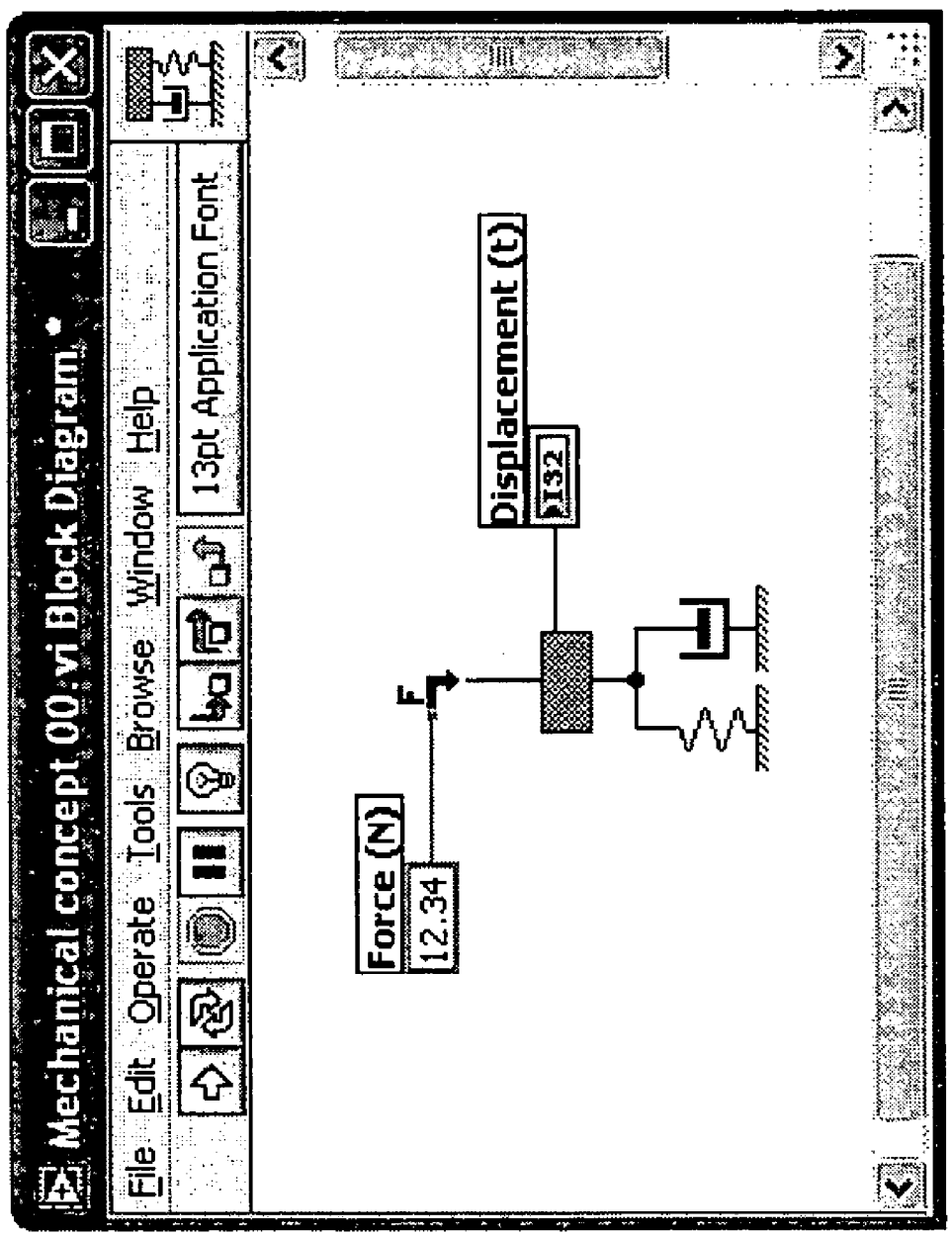
FIG. 21 illustrates an example of a graphical program block diagram representing a mechanical system.

FIG. 21 illsutrates an example of a graphical program block diagram representing a mechanical system.

Figure 22:
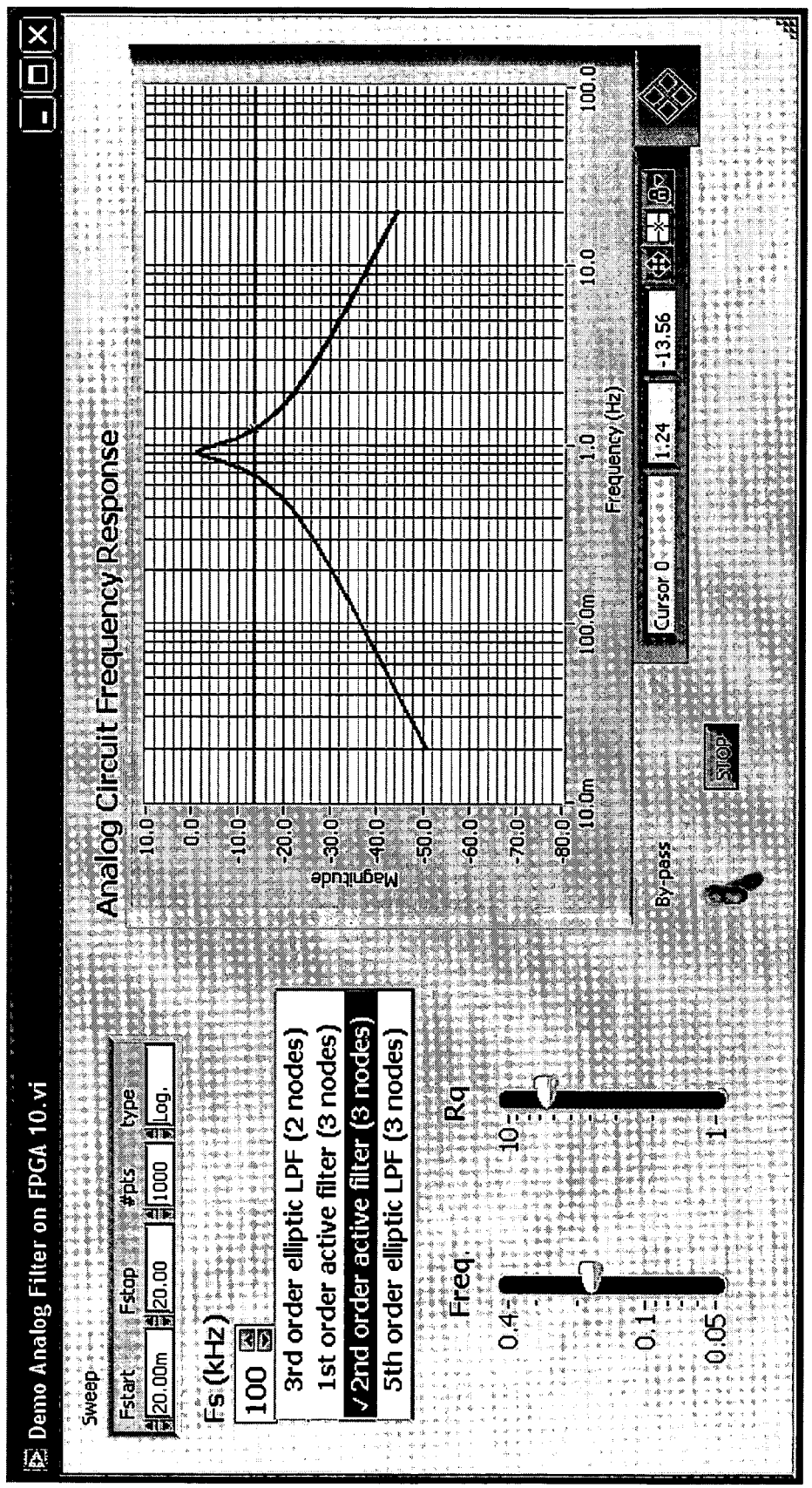
FIGS. 22A-D illustrate exemplary block diagrams of a graphical program that generates a system model to pass to the generic time domain solver on the FPGA device of FIG. 1B, based on options selected by the user.

FIG. 22 shows the front panel of the main VI that allows the user to control the simulation performed on the FPGA from the host PC. The pull-down menu allows the uer to change the entire topology of the simulated circuit on-the-fly (in real time). The different circuit topologies may or may not have a different number of nodes, but the change does not require a change the generic solver. The tow sliders (Freq and Rq) allow the user to change specific component values likewise on-the-fly without requiring the loading of a new solver.

Figure 23A:
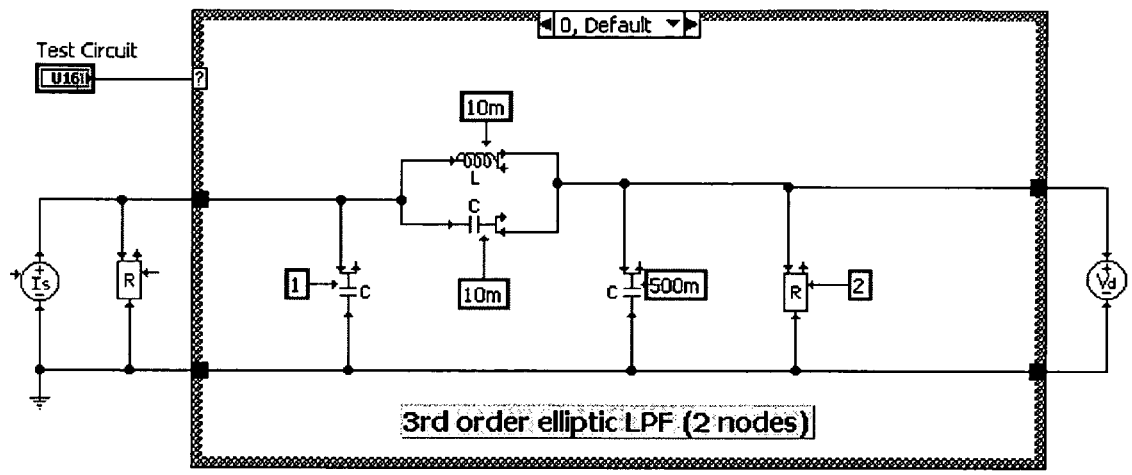
FIG. 23 illustrates the graphical user interface of the graphical program of FIG. 22, where the graphical user interface allows the user to select options affecting the system to be simulated on the FPGA device.
Figure 23B:
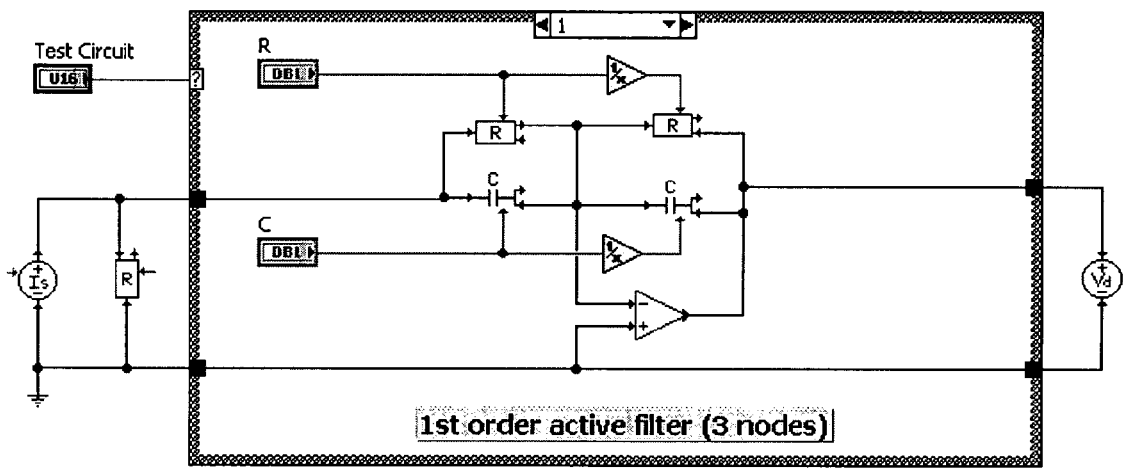
Figure 23C:
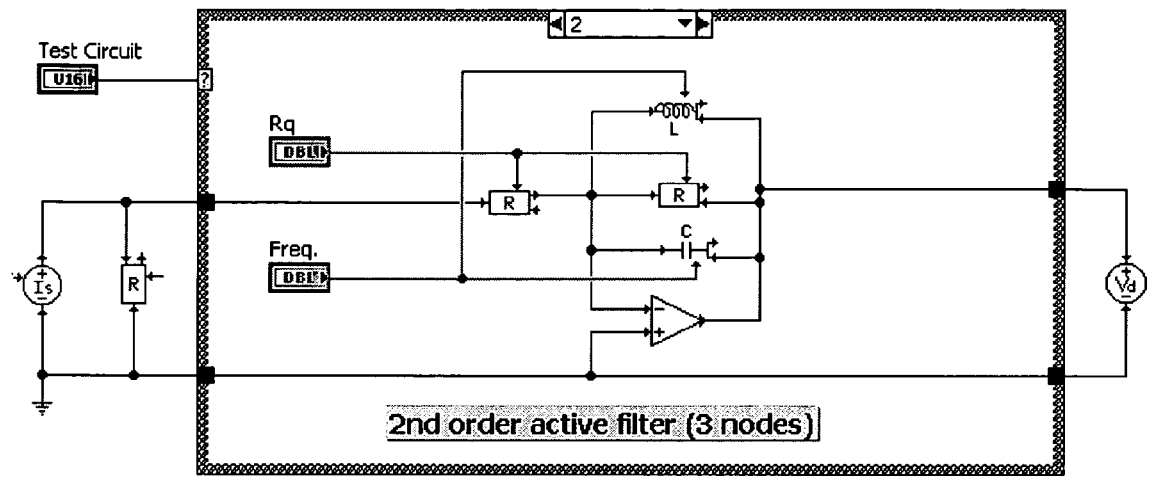
Figure 23D:
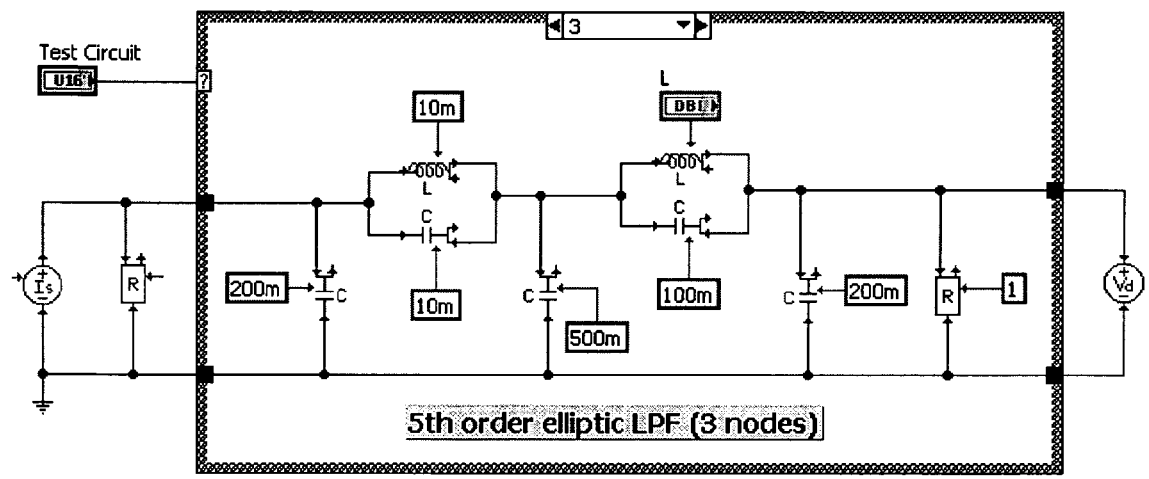
Figure 23E:
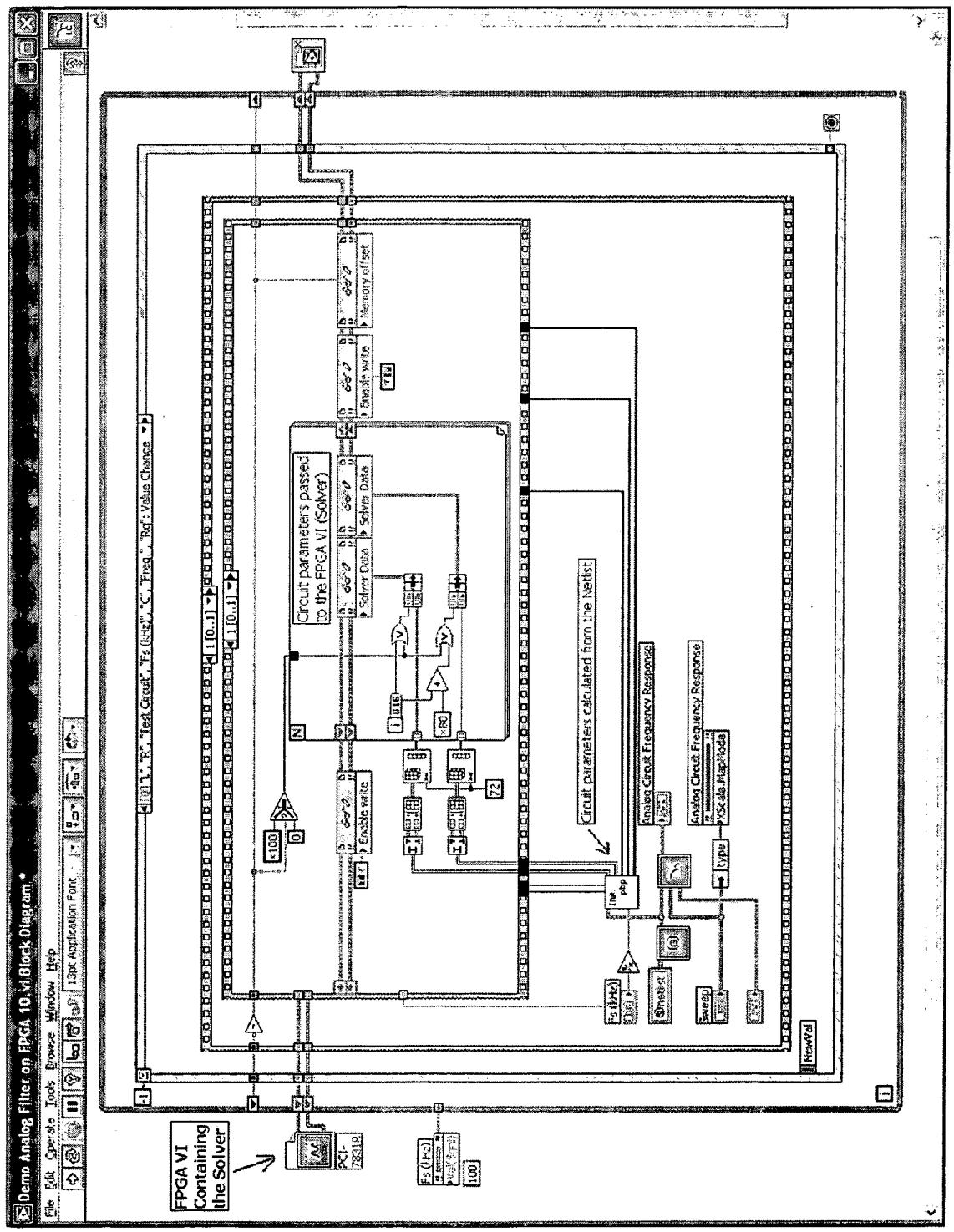

FIGS. 23A-23D show the 4 different circuit topologies that can be selected by the pull-down menu shown on FIG. 22. The component value change controls Freq and Rq can be seen on FIG. 23C. FIG. 23E illustrates a block diagram of a graphical program that executes on the computer system 82. The user may interact with a graphical user interface (e.g., the GUI of FIG. 22) to select options affecting the system to be simulated, and the block diagram of FIG. 23E generates a system model 208 (set of matrix coefficients) to pass to the generic time domain solver 82 on the FPGA device 200, based on the options selected by the user.

Figure 24:
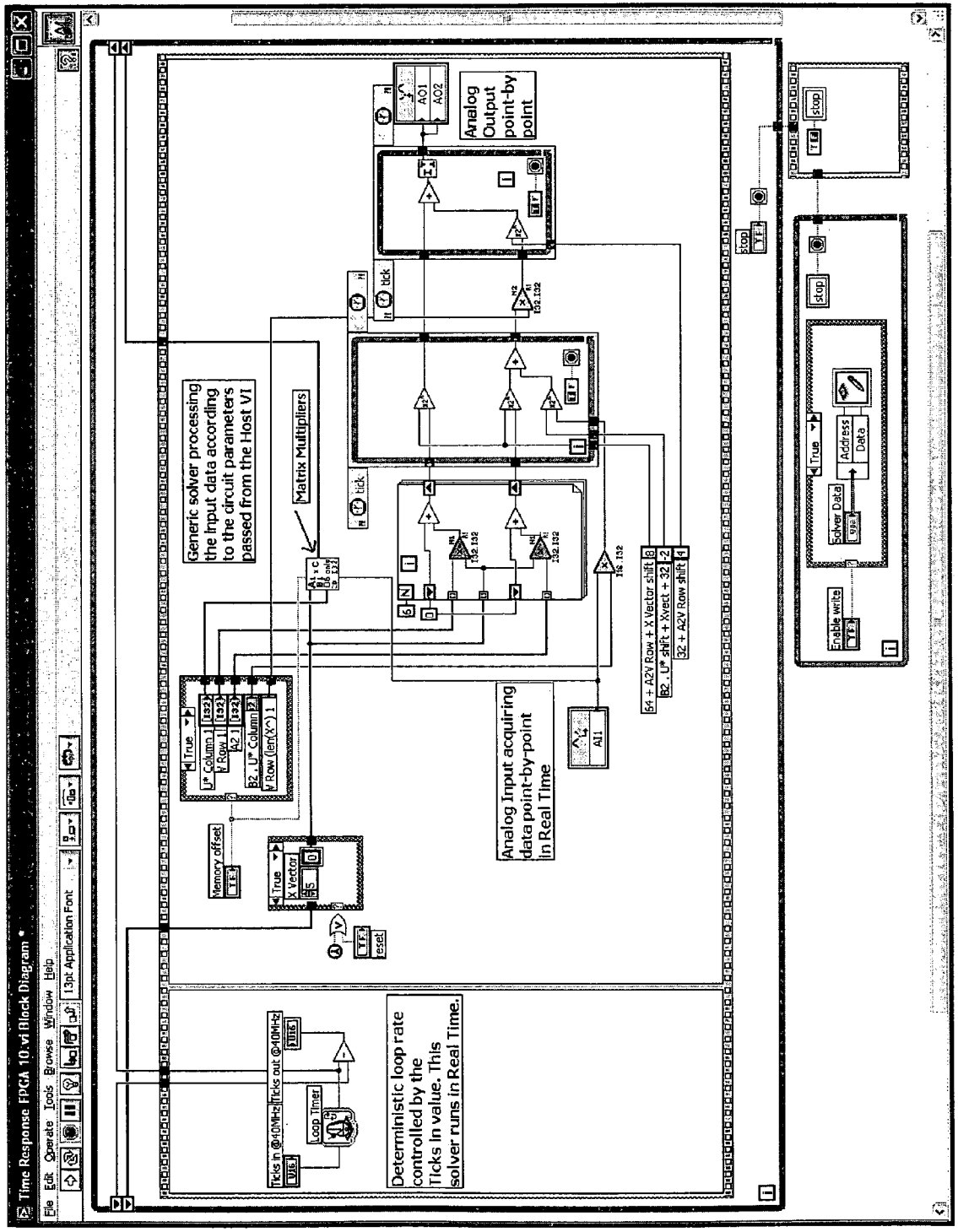
FIG. 24 illustrates the top-level block diagram of an exemplary graphical program representing one embodiment of a generic time domain solver.

FIG. 24 illustrates the top-level block diagram of an exemplary graphical program representing one embodiment of a generic time domain solver 206. The graphical program may be complied to a hardware configuration program to be uploaded to configure the FPGA 200 with the generic time domain solver 206.

As noted above, since the FPGA is itself reconfigurable, different solvers can be implemented on the FPGA. For example, where a plurality of different solvers have been pre-compiled, the bit file of a new respective pre-compiled solver can be implemented on the FPGA in the order of tens to hundreds of milliseconds. Where a new solver implementation requires a re-compile, this may take on the order of hours, due to the lengthy re-compile time. Thus, changes to the FPGA and the associated change time may comprise:

1) change to the system model—update coefficient values from RAM: microseconds;

2) change in the solver using a new pre-compiled solver: tens to hundreds of milliseconds;

3) change in the solver requiring a re-compile of the new solver: hours

Although the embodiments above have been described in considerable detail, numerous variations and modifications will become apparent to those skilled in the art once the above disclosure is fully appreciated. It is intended that the following claims be interpreted to embrace all such variations and modifications.

I claim:

1. A method for performing simulation, the method comprising:

configuring a programmable hardware element with a solver;

creating a first diagram by graphically selecting and interconnecting a first set of components on a display device, wherein the first diagram represents a first model;

generating first information based on the first diagram;

storing the first information on the programmable hardware element representing the first model, wherein the first information implements the first model on the programmable hardware element;

the solver in the programmable hardware element executing the first model based on the first information and at least one first input signal;

displaying a graphical user interface on the display device, wherein the graphical user interface is useable to modify the first model;

receiving user input to the graphical user interface to modify the first diagram to modify the first model;

generating second information based on the modified first diagram;

storing the second information on the programmable hardware element, wherein the second information implements the modified first model on the programmable hardware element; and the solver in the programmable hardware element executing the modified first model based on the second information and one or more of the at least one first input signal or a second input signal;

wherein said executing the first model, said generating the second information, said storing the second information on the programmable hardware element, and said executing the modified first model are performed so as to appear continuous and uninterrupted to the user.

2. The method of claim 1, wherein said receiving user input to the graphical user interface to modify the first model comprises:

receiving user changing at least one component value in the first model.

3. The method of claim 1, wherein said receiving user input to the graphical user interface to modify the first model comprises:

receiving user input adding or removing one or more components in the first diagram.

4. The method of claim 1, further comprising:

creating a second diagram by graphically selecting and interconnecting a second set of components on the display device, wherein the second diagram represents a second model;

wherein said receiving user input to the graphical user interface to modify the first diagram to modify the first model comprises replacing the first model with the second model, wherein the modified first diagram comprises the second diagram, and wherein the modified first model comprises the second model; and wherein said generating the second information comprises generating the second information based on the second diagram.

5. The method of claim 4, wherein the solver is independent from the first and second models such that the solver can simulate the first and second models without requiring the programmable hardware element to be reconfigured with a different solver.

6. The method of claim 1, wherein the first information comprises a first set of coefficients representing a first set of equations that represent the first model; and wherein the second information comprises a second set of coefficients representing a second set of equations that represent the modified first model.

7. The method of claim 6, wherein said storing the first information comprises transferring the first set of coefficients from a computer memory to memory on the programmable hardware element; and wherein said storing the second information comprises transferring the second set of coefficients from the computer memory to memory on the programmable hardware element.

8. The method of claim 6, wherein said receiving user input to the graphical user interface to modify the first model comprises:

receiving user input modifying at least one of the first set of coefficients; and wherein said generating second information comprises modifying the first information on the programmable hardware element in response to the user input.

9. The method of claim 1, coupling a first input device to the programmable hardware element;

coupling a first output device to the programmable hardware element;

the first input device generating the at least one first input signal;

the solver in the programmable hardware element generating at least one first output signal in response to executing the first model based on the first information and the at least one first input signal;

the first input device generating the at least one second input signal;

the solver in the programmable hardware element generating at least one second output signal in response to executing the modified first model based on the second information and the at least one second input signal.

10. The method of claim 1, wherein the first model comprises a model of an electronic circuit.

11. The method of claim 1, wherein the first model comprises a model of a mechanical system.

12. The method of claim 1, wherein the first model comprises a model of a chemical system or process.

13. The method of claim 1, wherein the first model comprises a model of a thermodynamic system or process.

14. The method of claim 1, wherein the programmable hardware element comprises a Field Programmable Gate Array (FPGA).

15. The method of claim 1,
wherein said configuring the programmable hardware element with the solver comprises:
generating a netlist based on the solver; and
configuring the programmable hardware element with the netlist.

16. The method of claim 1, wherein said storing second information on the programmable hardware element representing the modified first model and the solver in the programmable hardware element executing the modified first model are performed in less than a millisecond.

17. The method of claim 1,
wherein the solver executes the first model in real time; and
wherein the solver executes the second model in real time.

18. The method of claim 1, further comprising:
creating a graphical user interface for the first diagram in response to user input, wherein the graphical user interface is useable to modify the first model.

19. A system, comprising:
a computer system having a memory, wherein the memory stores program instructions for performing simulation; and
a programmable hardware element coupled to the computer system, wherein the programmable hardware element is configured with a solver, wherein the programmable hardware element also includes a memory portion;
wherein the program instructions are executable to:
create a first diagram in response to first user input graphically selecting and interconnecting a first set of components on a display device, wherein the first diagram represents a first model;
create a graphical user interface for the first diagram in response to second user input, wherein the graphical user interface is useable to modify the first model;
generate first information based on the first diagram;
store the first information in the memory portion of the programmable hardware element, wherein the first information specifies a first set of equations representing the first model;
wherein the solver in the programmable hardware element is configured to execute the first model based on the first information and at least one first input signal in real time;
wherein the program instructions are further executable to:
display the graphical user interface on the display device;
receive user input to the graphical user interface to modify the first diagram to modify the first model;
generate second information based on the modified first diagram; and
store the second information on the programmable hardware element, wherein the second information specifies a second set of equations representing the modified first model;
wherein the solver in the programmable hardware element is configured to execute the modified first model based on the second information and one or more of the at least one first input signal or a second input signal in real time;
wherein the system is configured such that said executing the first model, said generating the second information, said storing the second information on the programmable hardware element, and said executing the modified first model are performed to appear continuous and uninterrupted to the user.

20. The system of claim 19, wherein the user input to the graphical user interface to modify the first diagram to modify the first model comprises user input to change at least one component value in the first model.

21. The system of claim 19, wherein the user input to the graphical user interface to modify the first diagram to modify the first model comprises user input to add or remove one or more components in the first diagram.

22. The system of claim 19, wherein the program instructions are further executable to:
create a second diagram in response to user input graphically selecting and interconnecting a second set of components on the display device, wherein the second diagram represents a second model;
wherein the user input to the graphical user interface to modify the first diagram to modify the first model comprises user input to replace the first model with the second model, wherein the modified first diagram comprises the second diagram, and wherein the modified first model comprises the second model; and
wherein the second information is generated based on the second diagram.

23. The system of claim 19,
wherein the first information comprises a first set of coefficients representing the first set of equations that represent the first model; and
wherein the second information comprises a second set of coefficients representing the second set of equations that represent the modified first model.

* * * * *